(12) United States Patent
Kerzman et al.

(10) Patent No.: US 7,076,410 B1
(45) Date of Patent: *Jul. 11, 2006

(54) METHOD AND APPARATUS FOR EFFICIENTLY VIEWING A NUMBER OF SELECTED COMPONENTS USING A DATABASE EDITOR TOOL

(75) Inventors: Joseph P. Kerzman, New Brighton, MN (US); James E. Rezek, Mounds View, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/789,025

(22) Filed: Jan. 27, 1997

(51) Int. Cl.
G06G 7/48 (2006.01)
G06F 9/45 (2006.01)

(52) U.S. Cl. .................... 703/6; 716/8; 716/12
(58) Field of Classification Search ........... 364/488, 364/489, 490, 491; 716/8–14; 703/6
See application file for complete search history.

(56) References Cited

U.S. PATENT DOCUMENTS

| | | | | |
|---|---|---|---|---|
| 4,656,603 A | * | 4/1987 | Dunn ................ | 364/488 |
| 4,758,953 A | | 7/1988 | Morita et al. ....... | 364/300 |
| 4,813,013 A | * | 3/1989 | Dunn ................ | 364/488 |
| 4,831,543 A | | 5/1989 | Mastellone .......... | 364/489 |
| 4,918,614 A | | 4/1990 | Modarres et al. .... | 364/490 |
| 4,970,664 A | * | 11/1990 | Kaiser et al. ....... | 364/488 |
| 5,050,091 A | | 9/1991 | Rubin ............... | 364/488 |
| 5,164,908 A | | 11/1992 | Igarashi ............ | 364/491 |
| 5,175,696 A | | 12/1992 | Hooper et al. ....... | 364/489 |
| 5,222,029 A | | 6/1993 | Hooper et al. ....... | 364/489 |
| 5,255,363 A | | 10/1993 | Seyler .............. | 395/164 |
| 5,267,175 A | | 11/1993 | Hooper .............. | 364/489 |
| 5,341,309 A | | 8/1994 | Kawata .............. | 364/489 |
| 5,349,659 A | | 9/1994 | Do et al. ........... | 395/700 |
| 5,355,317 A | | 10/1994 | Talbott et al. ...... | 384/468 |
| 5,357,440 A | | 10/1994 | Talbott et al. ...... | 364/467 |
| 5,359,523 A | | 10/1994 | Talbott et al. ...... | 364/468 |
| 5,359,537 A | | 10/1994 | Saucier et al. ...... | 364/489 |
| 5,361,357 A | | 11/1994 | Kionka .............. | 395/700 |
| 5,398,195 A | | 3/1995 | Kim ................. | 364/491 |
| 5,406,497 A | | 4/1995 | Altheimer et al. .... | 364/489 |
| 5,416,721 A | * | 5/1995 | Nishiyama et al. ... | 364/491 |
| 5,418,733 A | | 5/1995 | Kamijima ............ | 364/490 |
| 5,418,954 A | | 5/1995 | Petrus .............. | 395/700 |
| 5,440,720 A | | 8/1995 | Baisuck et al. ...... | 395/500 |
| 5,483,461 A | | 1/1996 | Lee et al. .......... | 364/490 |
| 5,485,396 A | | 1/1996 | Brasen et al. ....... | 364/491 |
| 5,490,266 A | | 2/1996 | Sturges ............. | 395/500 |

(Continued)

OTHER PUBLICATIONS

Pages 6, 9, 37 and 42 of Appellants' specification.*

(Continued)

Primary Examiner—Hugh Jones
(74) Attorney, Agent, or Firm—Charles A. Johnson; Mark T. Starr; Nawrocki, Rooney & Sivertson, PA

(57) ABSTRACT

A method and apparatus for efficiently viewing selected cells using a database editor tool. By using a cell selection list that identifies a number of selected components, the present invention may allow the user to sequentially view the selected components by using a number of pre-defined "hot-keys". In addition, the present invention may automatically set the design hierarchy in the database editor tool to an appropriate level so that the component being viewed can be easily manipulated by the circuit designer.

41 Claims, 18 Drawing Sheets

U.S. PATENT DOCUMENTS

| | | | | |
|---|---|---|---|---|
| 5,490,268 A | | 2/1996 | Matsunaga | 395/550 |
| 5,491,640 A | | 2/1996 | Sharma et al. | 364/488 |
| 5,493,508 A | | 2/1996 | Dangelo et al. | 364/489 |
| 5,550,714 A | * | 8/1996 | Nishiyama | 364/490 |
| 5,555,201 A | * | 9/1996 | Dangelo et al. | 716/1 |
| 5,568,397 A | * | 10/1996 | Yamashita et al. | 364/491 |
| 5,581,202 A | * | 12/1996 | Yano et al. | 326/101 |
| 5,600,567 A | * | 2/1997 | Kucukcakar et al. | 364/488 |
| 5,703,789 A | * | 12/1997 | Beausang et al. | 716/4 |
| 5,721,959 A | * | 2/1998 | Nakamura et al. | 364/488 |
| 5,761,079 A | * | 6/1998 | Drumm | 364/489 |
| 5,903,466 A | * | 5/1999 | Beausang et al. | 716/18 |
| 6,684,376 B1 | * | 1/2004 | Kerzman et al. | 716/8 |

OTHER PUBLICATIONS

Tufte, "CML III Bipolar Standard Cell Library", Proceedings of the 1988 Bipolar Circuits and Technology Meeting, Minneapolis, Minnesota, Sep. 1988, pp. 180-182.

* cited by examiner

METHOD AND APPARATUS FOR EFFICIENTLY VIEWING A NUMBER OF SELECTED COMPONENTS USING A DATABASE EDITOR TOOL

CROSS REFERENCE TO CO-PENDING APPLICATIONS

The present application is related to U.S. patent application Ser. No. 08/789,026, filed Jan. 27, 1997, entitled "Method and Apparatus for Selecting Components Within a Circuit Des Database", U.S. patent application Ser. No. 08/789,024, filed Jan. 27, 1997, entitled "Method and Apparatus for Identifying Physical Errors in a Placement Database", U.S. patent application Ser. No. 08/789,027, filed Jan. 27, 1997, entitled "Method and Apparatus for Selectively Viewing Nets Within a Database Editor Tool", U.S. patent application Ser. No. 08/789,028, filed Jan. 27, 1997, entitled "Method and Apparatus for Associating Selected Circuit Instances and For Performing a Group Operation Thereon", U.S. patent application Ser. No. 08/789,029, filed Jan. 27, 1997, entitled "Method and Apparatus for Using a Placement Tool to Manipulate Cell Substitution Lists", U.S. patent application Ser. No. 08/598,506, filed Feb. 7, 1996 entitled "Method and Apparatus for Performing Drive Strength Adjust Optimization in a Circuit Design", U.S. patent application Ser. No. 08/597,931, filed Feb. 7, 1996 entitled "Method and Apparatus for Resolving Conflicts Between Cell Substitution Recommendations Provided by a Drive Strength Adjust Tool", all of which are assigned to the assignee of the present invention and all of which are incorporated herein by reference.

BACKGROUND OF THE INVENTION

1. Field of the Invention

The present invention generally relates to the viewing of circuit components of a circuit design database and more particularly relates to a method and apparatus for efficiently viewing a selected list of components using a database editor tool.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

Another common method for specifying the integrated circuit design is the use a schematic capture tool. A schematic capture tool allows the circuit designer to directly enter the schematics for the circuit design. Unlike a hardware description language, the resulting schematics often completely specify the logical and functional relationships among the components of the design.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. Note that the hierarchy is typically structured as a special kind of a graph called a tree. This resulting data structure is called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Constituent parts of new gate-level logic created during each pass through the logic design synthesis software are given computer-generated component and net names. Each time the logic design synthesis software is executed for the integrated circuit design, the component and net names which are generated by the software, and not explicitly defined by the user, may change, depending on whether new logic has been added to or deleted from the integrated circuit design. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer may remove logic from the design that is unnecessary, or otherwise improve the overall efficiency of the design. It is noted, however, that this action typically affects the component and net names generated by the logic synthesis tool.

It is also necessary to verify that the logic definition is correct and that the integrated circuit implements the function expected by the circuit designer. This verification is currently achieved by estimated timing and simulation software tools. The design undergoes design verification analysis in order to detect flaws in the design. The design is also analyzed by simulating the device resulting from the design to assess the functionality of the design. If errors are found or the resulting functionality is unacceptable, the designer modifies the behavior description as needed. These design iterations help to ensure that the design satisfies its requirements. As a result of each revision to the design, the logic design synthesis-generated component and net names may completely change. Further, the changes made by the logic optimizer may not be precisely known. Thus, the EDA tools downstream in the design process from the logic design synthesis software must be re-executed on the entire design.

After timing verification and functional simulation has been completed on the design, placement and routing of the design's components is performed. These steps involve assigning components of the design to locations on the integrated circuit chip and interconnecting the components to form nets. This may be accomplished using automated place and route tools.

After the circuit design is successfully placed and routed, the design is again verified for correctness. This may include a full verification step, including timing verification and design rule checks (DRCs). Timing verification may be accomplished by extracting parasitics from the layout of the circuit design, and providing the parasitics to a timing analysis tool. The timing analysis tool may use the parasitics, along with the timing models for each cell in the design, to identify any timing problems therein.

Design rule checks (DRCs) are typically performed by a DRC tool. Design rules are typically technology dependent, and are often provided by the integrated circuit manufacturer that will "process" the integrated circuit. Design rules may include spacing rules, overlap rules, minimum dimension rules, etc. For example, the minimum metal width for a particular metal layer may be 1.0 µm, and the minimum spacing between the metal traces may be 1.2 µm. These are only meant to be illustrative. Typical design rules are complex and often define both inter-layer rules as well as between-layer rules. DRC tools typically compare the layout of the circuit design with the predefined design rules, and report any design rule violations found therein.

Modern integrated circuits often contain tens of thousands of cells. There may be many errors found by the full verification process including both timing related problems and design rule violations. In either case, the circuit design must typically be edited to correct the detected violations. This may require the use of a database editor tool. The particular database editor tool that is used by a circuit designer may vary, depending on the type of violations. For example, if a logic error is detected, the circuit designer may use a schematic editor to correct the original schematics (if the logic is entered via a schematic capture tool rather than a HDL). Similarly, if a timing error is detected, a cell substitution list may be generated, and each cell substitution may be made in a physical database editor such as a placement tool. Likewise, if a design rule violation is detected, a physical database editor may be used to edit the physical database to correct the violation.

In all of the above cases, it may be important to view specific pre-identified cells or components that are involved in the detected errors. Once a circuit designer can view an offending cell, an editing function of the database editor tool may be used to correct the violation.

In prior art database editor tools, this correction process could be tedious and time-consuming because there was not an efficient method for locating the cells or nets involved in the violations. A circuit designer typically had to manually locate the violations by panning through the design using the database editor's graphics window. Even when the exact location of the violation was known, navigating to that location could be slow, particularly since the graphics terminal may be manipulating files that contained tens of thousands of objects. Further, once the violation was found, the database editor was not set to the proper level in the design hierarchy to immediately allow an editing function on the offending cell or component.

SUMMARY OF THE INVENTION

The present invention overcomes many of the disadvantages of the prior art by providing a method and apparatus for efficiently viewing selected components of a circuit design database using a database editor tool. By using a cell selection list that identifies the selected components, the present invention may allow the user to sequentially view the selected components by using a number of pre-defined "hot-keys" (e.g., "V key" or "CTRL-ALT-SHIFT Keys"). In addition, the present invention may automatically set the design hierarchy in the database editor tool to an appropriate level so that the component being viewed can be easily manipulated by the circuit designer.

In an exemplary embodiment, the cell selection list is a listing of a number of selected cells of a circuit design. The database editor tool may then read the cell selection list, and may provide a view frame around the first cell. The view frame may include a portion of the circuit design that is immediately surrounding the first cell. The database editor tool may display the first cell automatically upon reading the cell selection list or it may occur only after being initiated by the circuit designer. If initiated by the circuit designer, the circuit designer may first select a cell other than the first cell from the cell selection list for viewing. Further, the database editor may allow the circuit designer to specify how much of the circuit design surrounding the first cell is displayed in the view frame.

Thereafter, the circuit designer may view and/or edit the first cell and/or the surrounding circuit design, as desired. The present invention may automatically set the design hierarchy in the database editor tool to an appropriate context level, so that the first cell can be easily manipulated by the circuit designer. In a preferred embodiment, the hierarchical context level may be set at or above the level of hierarchy of the first cell.

The circuit designer may then hit a number of pre-defined "hot-keys", and the database editor may provide a view frame around the next succeeding cell in the cell selection list. Again, the circuit designer may view and/or edit the next cell and/or the surrounding circuit design, as desired. The circuit designer may continue to hit the number of pre-defined "hot-keys" to succeeding cells listed in the cell selection list. If the circuit designer hits the number of pre-defined "hot keys" after the last cell in the cell selection list is viewed, it is contemplated that the database editor may wrap around and again view the first cell listed in the cell selection list.

The cell selection list may be provided in any number of ways. For example, the cell selection list may be provided by external tools that check for cells that violate capacitance, length or timing rules, an external physical violations checking program that may provide a list of cells involved in a detected physical violation, such as off-grid or overlapping cells, or may be manually generated by a circuit designer. In any of these examples, the circuit designer may easily view the listed cells, using a database editor tool, by simply depressing the number of pre-defined "hot-keys".

It is contemplated that the cell selection list may identify nets as well as cells or components for viewing. That is, it may be desirable to view a specific net within the circuit design database, for example, a net involved in a timing violation. Thus, both cells and/or nets may be listed in the cell selection list.

It is recognized that any database editor tool may be used or adopted to be used in accordance with the present invention. Some examples of database editor tools that may be used include a schematic entry tool, a simulation tool, a floorplanning tool, a place and route tool, or any other tool that allows the circuit designer to view a representation of the circuit design. In a preferred embodiment, the database editor tool is a placement (e.g. floorplanning) tool.

As described above, the placement tool may read the cell selection list, and may sequentially view the cells listed therein. In a preferred embodiment, the cell selection list may be generated by a physical violations detector within the floorplanning tool. The physical violations could be due to overlapping cells, off-grid cells, or any other placement related violation. The physical violations detector is further described in U.S. patent application Ser. No. 08/789,024, filed Jan. 27, 1997, entitled "Method and Apparatus for Identifying Physical Errors in a Placement Database".

In addition, the cell selection list may be generated by an external timing tool and/or physical checking tool. As described in U.S. patent application Ser. No. 08/598,506, filed Feb. 7, 1996 entitled "Method and Apparatus for Performing Drive Strength Adjust Optimization in a Circuit Design", this tool may provide a cell selection list that includes a listing of cells that violate timing, capacitance, length, etc. requirements. The placement tool may then read the cell selection list and sequentially view the cello listed therein.

Further, the cell selection list may be generated by an "add net cells to overlap" feature of the placement tool. This option may build a cell selection list that includes cells that interface with selected nets within the design. That is, the circuit designer may select a number of critical nets, and the placement tool say assemble a cell selection list containing all cells connected to those selected nets. This may be particularly useful, for example, when analyzing critical timing paths.

Finally, the cell selection list may be generated manually by the circuit designer. This provides a degree of flexibility to the above process, because the circuit designer can designate any group of cells for viewing.

Finally, in accordance with the present invention, the placement tool may automatically set the design hierarchy to an appropriate context, so that the cell currently being viewed can be easily manipulated by the circuit designer. In a preferred embodiment, the hierarchical context may be set at or above the level of hierarchy of the cell currently being viewed.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
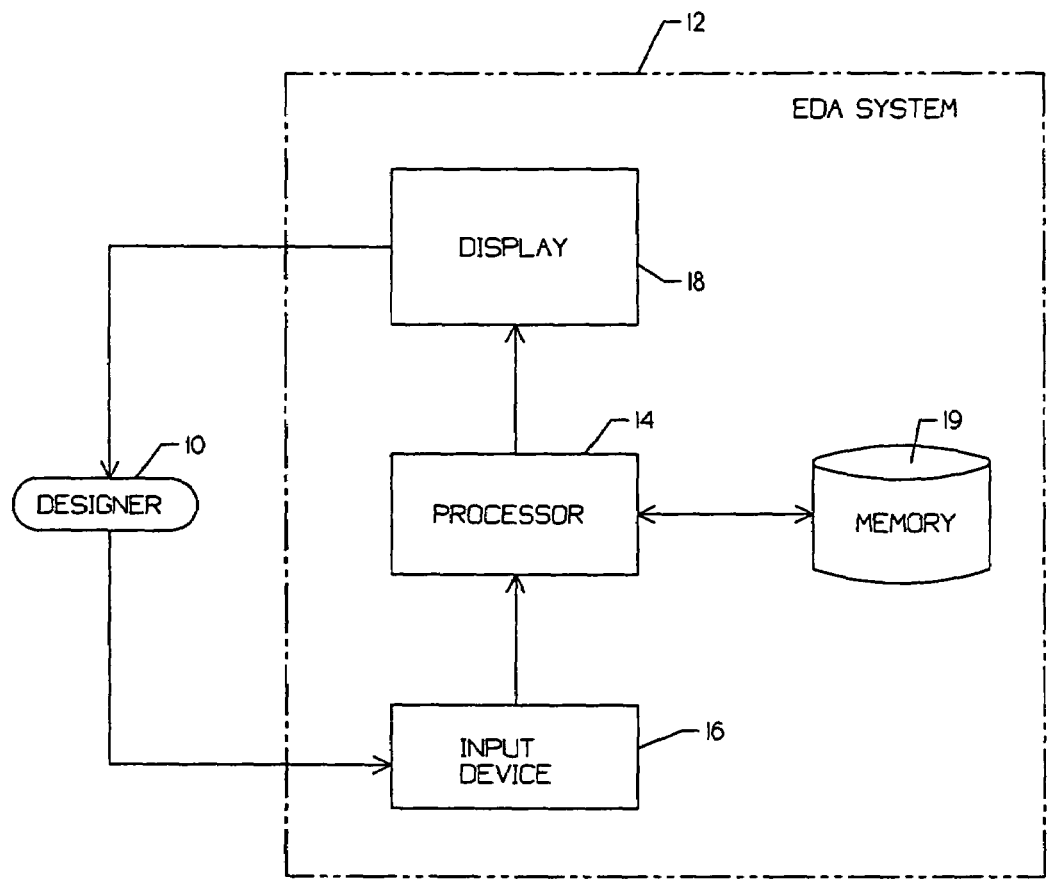
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floorplan), complete the final physical component placement and net interconnect routing (layout), perform delay calculation and timing analysis, and generate test patterns for manufacturing verification. During these remaining design processes, there are various attribute types and attribute values attached to the detailed description. Some of these attributes are generated by the integrated circuit designer (via software tool or tools), while other attributes are generated by the EDA software system. Names of components and nets are one of the main software-generated attributes.

Physical attribute values, especially component placement and interconnect routing coordinates, are contingent upon a name-based design. In other words, each attribute and its value is associated with a given name and the object the name represents. For the physical floorplanning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process usually includes a manual and automated portion, executed by the circuit designer and EDA software.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 19. The Memory may take the form of a semiconductor memory, magnetic disks, optical disks, magnetic tape or other mass storage device.

Figure 2:
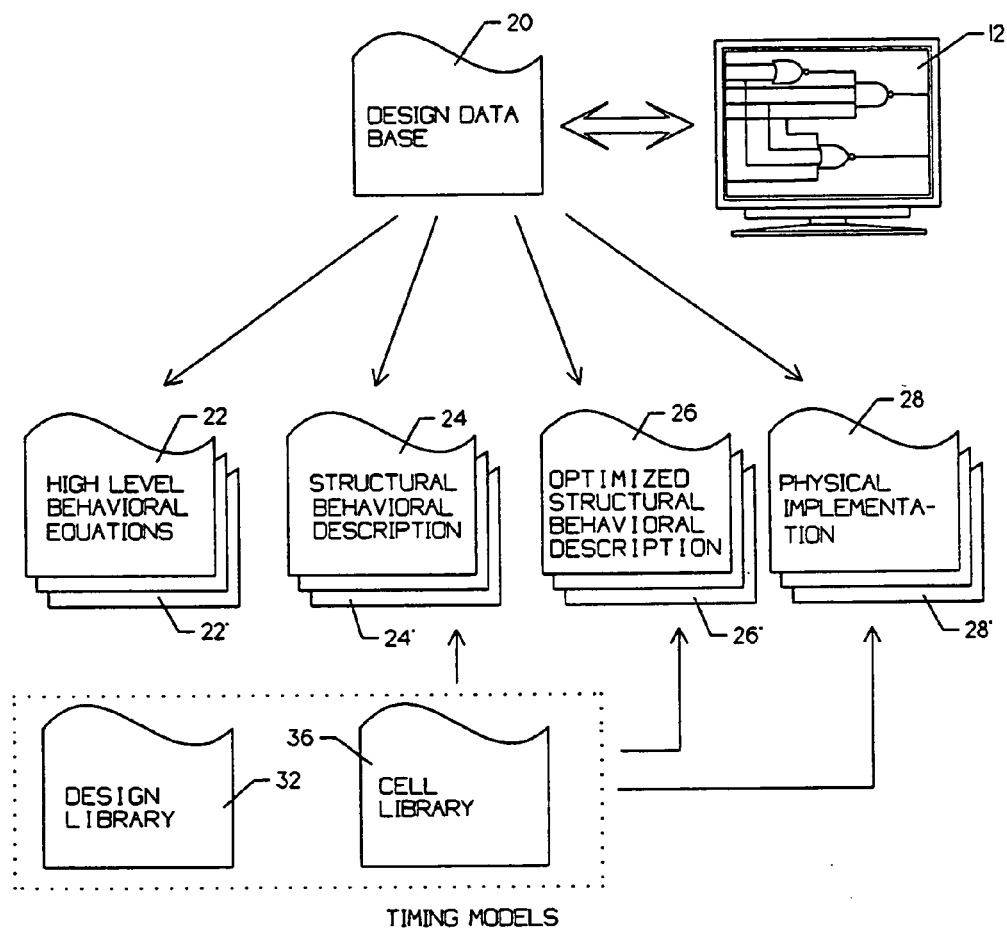
FIG. 2 is a block diagram showing typical circuit representations stored within a circuit design database.

FIG. 2 is a block diagram showing a number of circuit representations stored within a typical circuit design database. For example, the design database may include a high level behavioral representation 22, a structural behavioral description representation 24, an optimized structural behavioral representation 26, and a physical representation 28.

As indicated above, the circuit designer typically specifies the logic design of an integrated circuit by using design capture software that runs on an electronic design automation system 12. In the preferred embodiment, the Hardware Computer-Aided Design System (HCADS), available from Unisys Corporation, is used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 map to functional components of the design. In the preferred embodiment, the high level behavior description representation 22 is written in a design language called Universal Design Source Language (UDSL), although other existing, well-known hardware design languages could also be used.

The high level behavior description representation 22 may be input to a logic design synthesis tool. The logic design synthesis tool may assign the gates and other circuitry needed to implement the functions specified by the high level behavior description representation 22. In the preferred embodiment, the synthesis software comprises the Behavior to Structure Translator (BEST) synthesis tool developed by Unisys Corporation. However, alternate embodiments such as the VHDL Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural behavioral description representation 24, which is sometimes referred to as the net list for the design. This file contains the gate-level definition of the logic design. The structural behavioral description representation 24 may be in the Prime Behavior Description Language ('BDL), a format developed and used by the Unisys Corporation.

The structural behavioral description representation 24 may be provided to other EDA software programs, including an optimization program. The circuit optimization tool may read the structural behavioral description representation 24 and optimize the logic represented therein. Typically, the optimization tool may read and write Electronic Data Interchange Format (EDIF) files. The EDIF format is an industry standard format for hardware design language information. Thus, embedded within a typical optimization tool is an EDIF reader and an EDIF writer. The EDIF writer and reader translate the circuit design database 20 from an internal format to and from the EDIF format. It is recognized that the EDIF reader and EDIF writer programs may have to be provided by the user, depending on the format of the internal circuit design database.

The optimization methodology used by the optimization tool may be selectable by the user. For example, the user may direct the optimization tool to optimize a particular portion of the circuit design such that power, area, speed or other predefined parameter is optimized. Further, the optimization program may optimize the structural behavioral description representation 24 using components from a selected cell library 36 or design library 32. The optimization program may provide an optimized structural behavioral description representation, as shown at 26. In the preferred embodiment, the optimization program is the Design Compiler, commercially available from Synopsys, Inc.

The optimized structural behavioral description representation 26 may then be placed and routed using a commercially available place and route tool. In the preferred embodiment, the place and route tool Gate Ensemble, provided by Cadence Design Systems, Inc. is utilized, although other firms active in the electronic design automation (EDA) industry sell systems similar in function to the above-mentioned Cadence tool.

The result may be stored in the circuit design database 20 as a physical implementation representation 28. As shown in FIG. 2, typical cell libraries include a number of representations of each component therein including a symbol representation, a schematic representation and a physical representation. This is also true for components in the design library 32. The physical implementation representation 28 of the circuit design database 20 typically includes references to the physical representation of the library components referenced therein.

Figure 3:
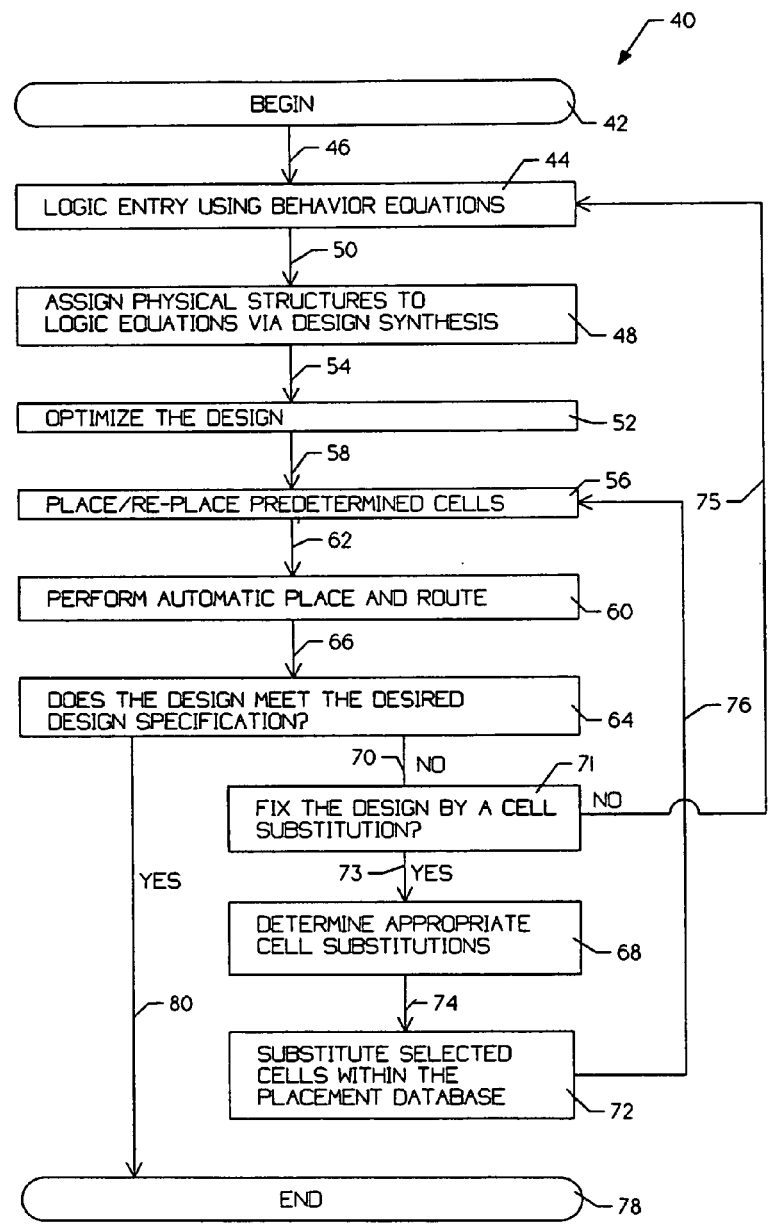
FIG. 3 is a flow diagram showing illustrative design steps in accordance with an exemplary embodiment of the present invention.

FIG. 3 is a flow diagram showing illustrative design steps in accordance with an exemplary embodiment of the present invention. The flow diagram is generally shown at 40 and is entered at element 42. Control is passed to element 44 via interface 46. Element 44 allows a circuit designer to enter the logic of a circuit design using behavioral equations. Control is then passed to element 48 via interface 50. Element 48 assigns physical structures the logic equations via design synthesis. Control is then passed to element 52 via interface 54. Element 52 optimizes the circuit design. Control is then passed to element 56 via interface 58. Element 56 places predetermined cells within the circuit design. In a preferred embodiment, this is performed by a circuit designer using a floorplan tool. Control is then passed to element 60 via interface 62. Element 60 automatically places and routes the remainder of the circuit design. Control is then passed to element 64 via interface 66. Element 64 determines whether the design meets the desired design specification.

If the design does not meet the desired design specification, control is passed to element 71 via interface 70. Element 71 determines whether the design can likely be corrected by a cell substitution. If the design can likely be corrected by a cell substitution, control is passed to element 68 via interface 73. Element 68 determines appropriate cell substitutions. Control is then passed to element 72 via interface 74. Element 72 substitutes selected cells within the placement database. Control is then passed back to element 56 via interface 76, wherein predetermined cells are re-placed. Referring back to element 71, if the design cannot be corrected by a cell substitution, control is passed to element 44 via interface 75, wherein the logic equations are modified.

The loop comprising elements 56, 60, 64, 68 and 72, and potentially the loop comprising elements 44, 48, 52, 56, 60, 64 and 71, is repeated until the design meets the desired design specification. Once the design meets the desired design specification, control is passed from element 64 to element 78 via interface 80, wherein the algorithm is exited. It is recognized that the above-described design flow is only exemplary, and that variations thereof are contemplated.

Figure 4:
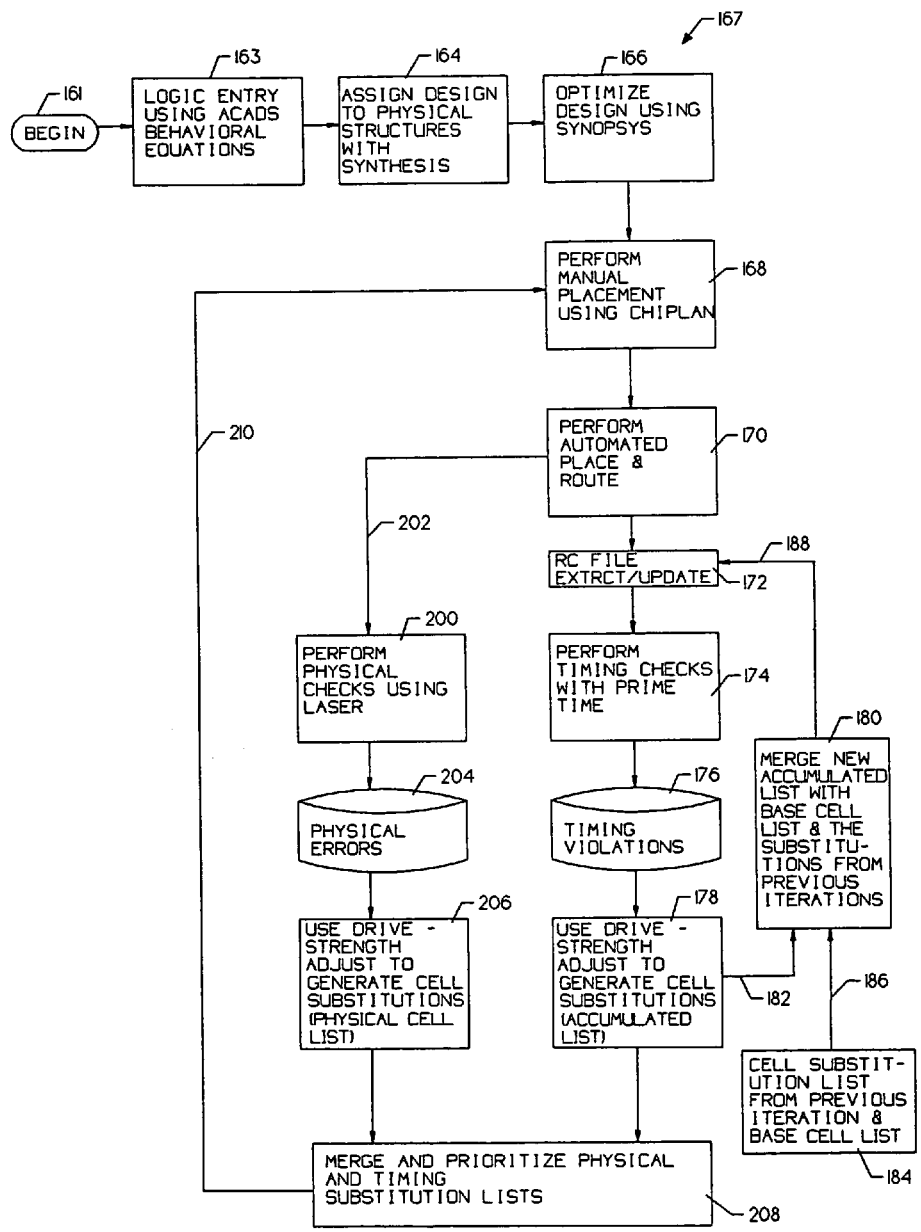
FIG. 4 is a flow diagram showing an illustrative design method in accordance with the present invention.

FIG. 4 is a flow diagram showing an illustrative design method in accordance with the present invention. The diagram is generally shown at 167. The method is entered at element 161. A logic designer typically enters logical equations describing the function of the design, as shown at 163. In the exemplary embodiment, logic entry is performed using HCADs Design Capture software, available from the Unisys Corporation. A first synthesis tool 164 may then implement the logical equations using logical cells from a component library. A second synthesis tool 166 may then minimize the logic using known techniques, and may attempt to optimize the design based on a number of predetermined factors. For example, the designer may direct the synthesis tool to optimize the design for speed, power, or some other factor. In the exemplary embodiment, a widely known synthesis tool called Design Compiler marketed by SYNOPSYS is used. The output of the second synthesis tool may be a design netlist, and preferably in the EDIF format.

The resulting design netlist may then be provided to a manual placement tool as shown at 168. In some cases, it is advantageous to manually place data paths, as well as certain critical cells within the design. The manual placement of these cells is typically accomplished via a floor-planning tool. Stand alone floor-planning tools are available. However, many place and route tools have at least a limited floor-planning capability. After these cells are manually placed by the designer, the remaining cells may be automatically placed and routed by the place and route tool, as shown at 170.

After the place and route netlist is generated, the designer may use an extraction tool to extract an RC file therefrom as shown at 172. The extraction tool may process the place and route netlist and may determine the resistance, capacitance, or any other parameters selected by the designer, for each net in the design. For example, the extraction tool may determine the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 174. The timing analysis tool processes the netlist and the RC file to determine the timing of predetermined circuit paths within the design. Part of the pre-processing performed by the timing analysis tool is to read the timing information from the component library for each of the cells used in the design.

For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist, and may store a record of the timing violations as shown at 176.

If the timing analysis tool identifies timing violations, the designer must evaluate each timing violation, and provide corrections to the design to overcome such timing violations. To mitigate any timing violations that may exist, a first drive strength adjust tool 178 may be provided to identify selected components along selected timing paths to substitute with a corresponding logically equivalent component having a different drive strength, at the expense of a potential increase in size. The first drive strength adjust tool 178 is further described in U.S. patent application Ser. No. 08/598,506, filed Feb. 7, 1996 entitled "Method and Apparatus for Performing Drive Strength Adjust Optimization in a Circuit Design", and U.S. patent application Ser. No. 08/597,931, filed Feb. 7, 1996 entitled "Method and Apparatus for Resolving Conflicts Between Cell Substitution Recommendations Provided by a Drive Strength Adjust Tool".

After selected cells have been identified for substitution by the first drive strength adjust tool 178, an accumulated cell substitution list is created. The accumulated cell substitution list identifies the cells that are to be substituted during the present design iteration. The accumulated cell substitution list may be provided to a first merging step 180 via interface 182. Further, a base cell substitution list 184 is provided to the first merging step 180 via interface 186. In the exemplary embodiment, the base cell substitution list is updated each design iteration and thus contains a master list of all cell substitutions.

The first merging step 180 merges the accumulated cell substitution list with the base cell substitution list thereby resulting in an updated base cell substitution list.

It is contemplated that the first merging step 180 may resolve any conflict between the accumulated cell substitution list and the base cell substitution list. An example of when a conflict may arise is when a particular cell is identified in more than one timing path during different design iterations. That is, the base cell substitution list may identify a particular cell within a first timing path and may indicate that the particular cell is to be substituted with a logically equivalent cell having a first drive strength. The accumulated cell substitution list, and during the current design iteration, may also identify the same cell within a second timing path and may indicate that the particular cell is to be substituted with a logically equivalent cell having a second drive strength. It is contemplated that the first merging step 180 may resolve this and other conflicts. In a preferred embodiment, the conflict is resolved based upon a predetermined priority scheme. Further details of the preferred priority scheme may be found below.

The updated base cell substitution list may be provided to the extracting tool 172, wherein an updated RC file may be generated and provided to the timing analysis tool 174 for the next design iteration. The extraction tool 172 may process the original place and route netlist and the updated base cell substitution list and may determine the resistance, capacitance, or any other parameters selected by the designer, for each net in the design.

Unlike the prior art, it is recognized that it is not necessary to repeat the place and route step 170 during each design iteration. That is, it is recognized that the placement and routing of the design does not significantly change, particularly when only cell substitutions are made to the design database. Further, it is recognized that the behavioral equations need not be updated during each design iteration. Thus, the behavioral equations need not be synthesized during each of the subsequent design iterations. This may significantly reduce the design cycle time.

In the exemplary embodiment, the process of extracting an RC file, performing timing analysis, identifying cells for substitution, creating an accumulated cell substitution list, and merging the accumulated cell substitution list with the base cell substitution list may be repeated until the design falls within the design specification, or until a predetermined number of design iterations has been reached.

In addition to the above, it is contemplated that the exemplary embodiment may perform physical checks on the circuit design as shown at 200. The physical checks step 200 may indicate any physical check violations therein, and the physical check violations may be stored as shown at 204.

If physical checks violations are detected, a second drive strength adjust tool 206 may be provided for selecting cells for substitution with a corresponding logically equivalent component having a different drive strength to mitigate such physical check violations. It is contemplated that the cells selected by the second drive strength adjust step 206 may be recorded in a physical checks substitution list as shown at 206.

After the above described timing violation design iterations are complete, and the design meets the predetermined timing specification, a second merging step 208 may merge the accumulated cell substitution list with the physical checks substitution list. It is contemplated that the second merging step 208 may resolve any conflict between the accumulated cell substitution list and the physical checks substitution list, as described above.

An example of when a conflict may arise during the second merging step 208 is when a particular cell is identified both by the first drive strength adjust tool 178 and the second drive strength adjust tool 206. That is, the accumulated cell substitution list may indicate that a particular cell is to be substituted with a logically equivalent cell having a first drive strength to correct a timing violation. The second drive strength adjust tool 206 may also identify the same cell and may indicate that the particular cell is to be substituted with a logically equivalent cell having a second drive strength to correct a physical checks violation. These conflicts are preferably resolved using a predetermined priority scheme, as described in U.S. patent application Ser. No. 08/597,931, entitled "Method and Apparatus for Resolving Conflicts Between Cell Substitution Recommendations Provided by a Drive Strength Adjust Tool, which has been incorporated herein by reference.

After all conflicts are resolved, the second merging step 208 may provide a final substitution list. In the exemplary embodiment, the final substitution list is provided to a floorplan tool 168 (e.g., CHIPLAN) via interface 210. The designer may then make the necessary modifications to the design database. Thereafter, the design database may be provided to the place and route tool, for final placement and routing. The exemplary method may then be exited (not shown), or the process may be repeated to verify that the design database meets the circuit design specification.

Figure 5:
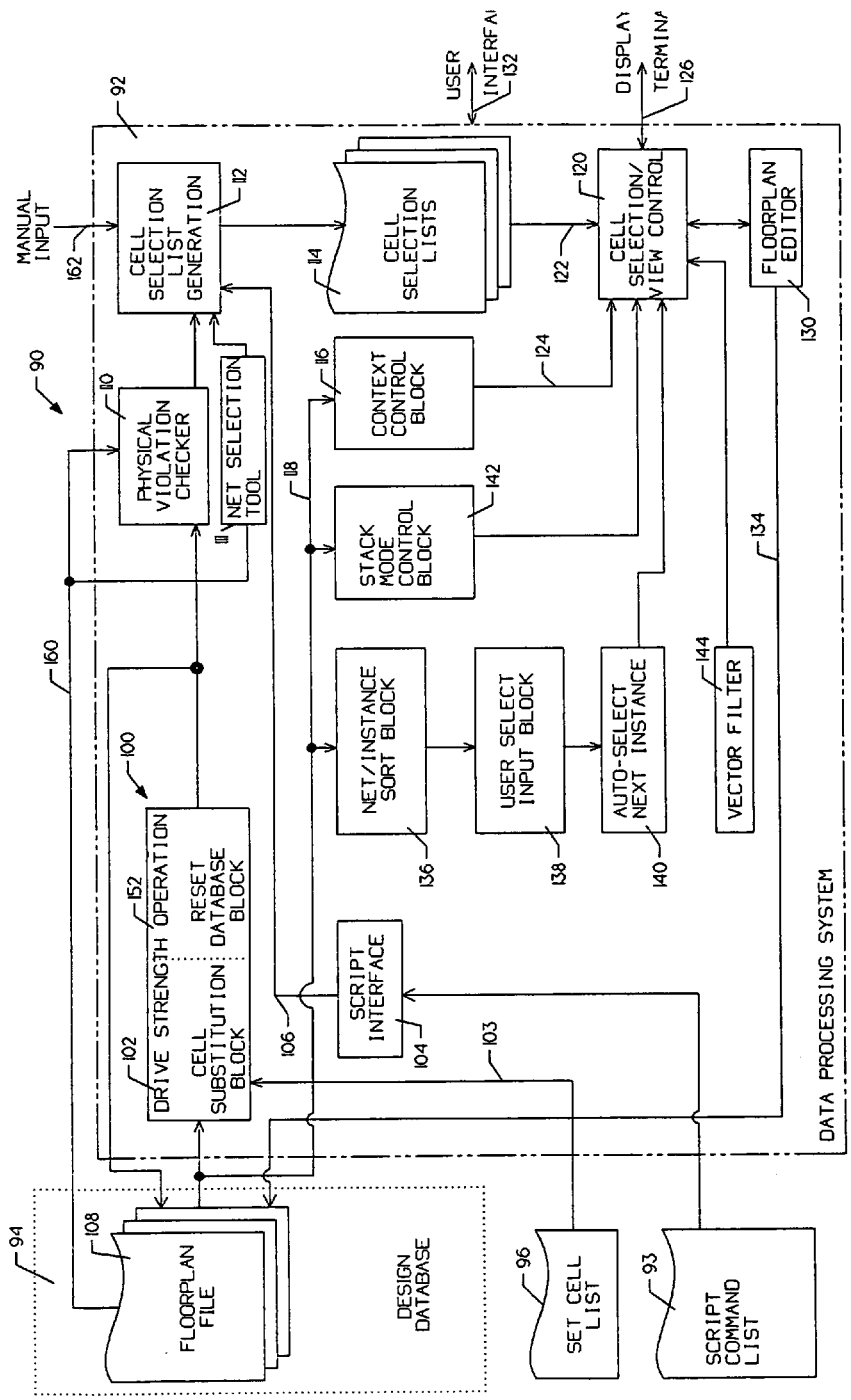
FIG. 5 is a block diagram of a first exemplary data processing system for affecting placement of a circuit design database, in accordance with the present invention.

FIG. 5 is a block diagram of a data processing system 92 for affecting placement of a circuit design in accordance with the present invention. The diagram is generally shown at 90. The data processing system 92 is coupled to a design database 94, a set cell list 96, AND A SCRIPT INTERFACE LIST 93. The design database 94 may include a floorplan file 108. The floorplan file 108 is part of the design database 94, and may include the information and data related to the floorplan, or placement, of the circuit design. In a preferred embodiment, the floorplan file is the only part of the design database 94 that is updated or changed during the floorplanning process.

The generation of the set cell list 96 is described in U.S. patent application Ser. No. 08/598,506, filed Feb. 7, 1996, entitled "Method and Apparatus for Performing Drive Strength Adjust Optimization in a Circuit Design", and U.S. patent application Ser. No. 08/597,931, filed Feb. 7, 1996, entitled "Method and Apparatus for Resolving Conflicts Between Cell Substitution Recommendations Provided by a Drive Strength Adjust Tool", both of which have been incorporated herein by reference. The set cell list 96 contains a list of desired cell substitutions.

The set cell list 96 may be provided to a drive strength operations block 100, via interface 103. Cell substitution block 102 may read the floorplan file 108, and may substitute the specified cells with predetermined cells having a different performance characteristic. In a preferred embodiment, the set cell list 96 identifies certain cells within the current floorplan file 108, and identifies a corresponding cell having a different drive strength for substitution.

After substitution, the cell substitution block 102 writes the results back to the floorplan file 108. A number of previous revisions of floorplan file 108 may be saved, as shown. The floorplan file 108 thus includes the cell substitutions provided by cell substitution block. Because the cell substitution block 102 may only replace the data object within the floorplan file 108, and may not modify the placement of adjacent cells, some of the replacement cells may, for example, overlap adjacent cells or otherwise violate predefined placement rules. This may be particularly true if the replacement cells are physically larger than the original cells. See, for example, U.S. patent application Ser. No. 08/598,506, filed Feb. 7, 1996, entitled "Method and Apparatus for Performing Drive Strength Adjust Optimization in a Circuit Design", and U.S. patent application Ser. No. 08/597,931, filed Feb. 7, 1996, entitled "Method and Apparatus for Resolving Conflicts Between Cell Substitution Recommendations Provided by a Drive Strength Adjust Tool".

To detect physical violations caused by the cell substitution block 102, the floorplan file 108 may be provided to a physical violations checker block 110. The physical violations checker block 110 may detect predetermined physical violations in the floorplan file 108. The physical violations checker 110 may provide the detected physical violations to a cell selection list generation block 112. The cell selection list generation block 112 may generate a list of cells that are involved in the detected physical violations. This may be controlled, at least in part, by script commands provided via interface 106. The resulting list of cells may be formatted into a cell selection list 114. It is contemplated that the cell selection list may also be provided by other input means including manual input interface 132, net selection tool 111, or directly from the script interface 104 via interface 106.

In a preferred embodiment, the cell selection list 114 is a list of cells that are to be sequentially selected by the data processing system, thereby enabling a user to manually correct the detected physical violations. Thus, the cell selection list 114 may be provided to a cell selection/view control block 120. The cell selection/view control block 120 may sequentially select and display each of the cells in the cell selection list 114.

The cell selection/view control block 120 may be coupled to a display terminal via interface 126 and to a floorplan editor 130. The display terminal is used to display the current cell and surrounding cells. In a preferred embodiment, the cell selection/view control block 120 selects the current cell from the cell selection list 114, and zooms in and displays the current cell on the display device. Thereafter, the user may use the floorplan editor 130 via interface 132 to edit the floorplan file to correct the detected physical violation. After each of the cells identified in the cell selection list 114 has been sequentially operated upon by the cell selection/view control block, the user may direct the floorplan editor to store the floorplan file via interface 134. The above design process is also described in U.S. patent application Ser. No. 08/789,024, filed Jan. 27, 1997, entitled "Method and Apparatus for Identifying Physical Errors in a Placement Database".

The above method is extremely valuable, particularly since large number of errors may be detected by the physical violations checker block 110. In the past, a circuit designer typically had to manually locate each violation by panning through the design in a floorplanning graphics window. Even when the exact location of a violation was known, navigating to that point could be slow, since the graphics terminal was often manipulating files containing tens of thousands of gates.

It is contemplated that the physical violations checker 110 may read the floorplan file 108 directly via interface 160. This may allow the physical violations checker 110 to detect violations in the floorplan file 108, without first performing a cell substitution. This may be particularly useful when the physical violations checker 110 can detect violations other than those caused by cell substitutions.

In some cases, a cell substitution may cause the performance of the design to decrease or otherwise not have the intended effect. Under these circumstances, it may be desirable to undo the cell substitutions made by cell substitution block 102, and revert back to a previous design iteration. A reset database block 152 may be provided to accomplish this task. The reset database block 152 may read the floorplan file 108, and may reset the floorplan file 108 back to a previous state. The set cell list 96 may then be exported and used by a drive strength adjust tool, as the basis for a new cell substitution. An exemplary drive strength adjust tool is discussed in U.S. patent application Ser. No. 08/598,506, filed on Feb. 7, 1996, and entitled "Method and Apparatus for Performing Drive Strength Adjust Optimization in a Circuit Design".

A number of features may be incorporated into the data processing system to aid in the placement of the design database 94. A context control block 116 may read the floorplan file 108 via interface 118, and may set the current context to a selected hierarchical level. A context is a level of hierarchy within the design database, and often corresponds to a region. The working environment of a corresponding floorplanning tool may be set to the current context. By setting the working environment in this manner, only those cells or regions at one level below the context are displayed in a physical window (for example, a physical window that displays all unplaced cells). This feature may allow a circuit designer to work on a selected portion of the design, without having to sift through the cells and regions that are outside of the current context.

In addition to the above, providing a context as the working environment may make the selection of cells or regions within the context easier, especially if two or more regions overlap. That is, in the present invention, the floorplanning tool may select only those cells and regions that are within the current context. Cells and interconnect outside the current context are still visible. This may be accomplished by enabling for selection only those cells that are associated with the selected context.

It has been recognized that the selection of a region within a floorplanning window can be difficult, particularly when one or more regions overlap. To overcome this limitation, the context control block 116 may include a feature for maneuvering through the circuit design hierarchy, selecting cells or regions, and setting the context accordingly. In a preferred embodiment, this is accomplished by using predetermined up and down hot-keys. This feature may allow a circuit designer to select a predetermined context by selecting a cell or region known to be in a predetermined context, and then hitting an up hot-key to select the predetermined context. This feature may also allow a circuit designer to set the current context to a context lower in the design hierarchy by hitting a down hot-key. Thus, the up and down hot-key feature may allow a circuit designer to easily change the current context to a different hierarchical level from within the floorplanning window.

In contrast to the above, and in prior art placement tools, changing and selecting contexts within the floorplanning window was tedious, especially if regions overlapped. That is, and as indicated above, prior art tools typically cycled through the various overlapping regions until the desired region was finally located by the circuit designer. This was often slow and tedious because the regions were often large, including thousands of gates, and the selection process could involve loading the context information into local memory.

It is contemplated that the data processing system 92 may further include a net/instance sort block 136, a user select block 138, and an auto-select next instance block 140. The net/instance sort block 136 may sort un-placed cells and regions by instance name, and display the results in a physical window. By sorting the un-placed cells in a predetermined way (e.g. by a corresponding net name or instance name), the circuit designer may more easily find a desired cell or region for placement.

In prior floorplanning tools, and as indicated above, when a context was loaded, all of the children cells appeared as a pseudo random list of names in a physical window. Since large contexts often contain thousands of instance names, the physical window provided little utility during the placement process. The circuit designer simply had to scroll through the often lengthy list of instances in an attempt to identify the desired object. It was often more efficient for the circuit designer to determine an instance name by cross-referencing an external listing so that the name could be entered manually prior to placement.

A further advantage of the net/instance sort block 136 is that a circuit designer may more easily define object groups, thereby allowing user defined group operations to more readily be performed. For example, a circuit designer may place all drivers for a vectored net by first performing a net sort, and then placing the first component in the group and specifying a direction for further group placement. The floorplanning tool may then incorporate features that allow the circuit designer to place all remaining cells in the group automatically (see for example, U.S. patent application Ser. No. 08/789,028, filed Jan. 27, 1997, which has been incorporated herein by reference). In the past, this simple operation could require the circuit designer to manually find each instance name, either from some external printout or by panning through the unsorted list within a physical window, and individually place each object.

The user select input block 138 allows a circuit designer to select a desired cell or region from the sorted list of cells provided by net/instance sort block 136. Auto-select next instance block 140 automatically selects the next cell or region in the sorted list of cells, thus allowing the user to sequentially place the cells or regions one after another. It is recognized that this may be particularly useful for placing cells that drive or receive vectored nets.

The data processing system 92 may further include a stack mode control block 142. The stack mode control block 142 may read the design database 94 and detect which groups of cells or regions have been defined as a stack. In a preferred embodiment, the design database 94 includes information which identifies selected cells as belonging to a particular stack. Once the stacks are identified, the stack mode control block 142 may allow the user to perform group operations on the stack. For example, all cells in the stack may be moved by simply moving the stack. Further, all cells in the stack may be placed by placing a first one of the cells and indicating a placement direction and spacing for the remaining cells of the stack. The stack mode control block 142 may automatically place the remaining cells in the specified direction and at the specified spacing. The stack mode control block is more fully described in U.S. patent application Ser. No. 08/789,028, filed Jan. 27, 1997, entitled "Method and Apparatus for Associating Selected Circuit Instances and for Performing a Group Operation Thereon".

Finally, data processing system 92 may include a vector filter block 144. Vectored filter block 144 may be coupled to the cell selection/view control block 120. Vector filter block 144 may allow a user to view only those vectored nets that are wider than a predetermined threshold, narrower than a predetermined threshold, or fall within a predetermined range. This may reduce the visual complexity of the circuit design on the display device, and may allow the circuit designer to more effectively analyze vectored net paths. A further discussion of the vector filter 144 can be found in U.S. patent application Ser. No. 08/789,027, filed Jan. 27, 1997, entitled "Method and Apparatus for Selectively Viewing Nets Within a Database Editor Tool".

Figure 6:
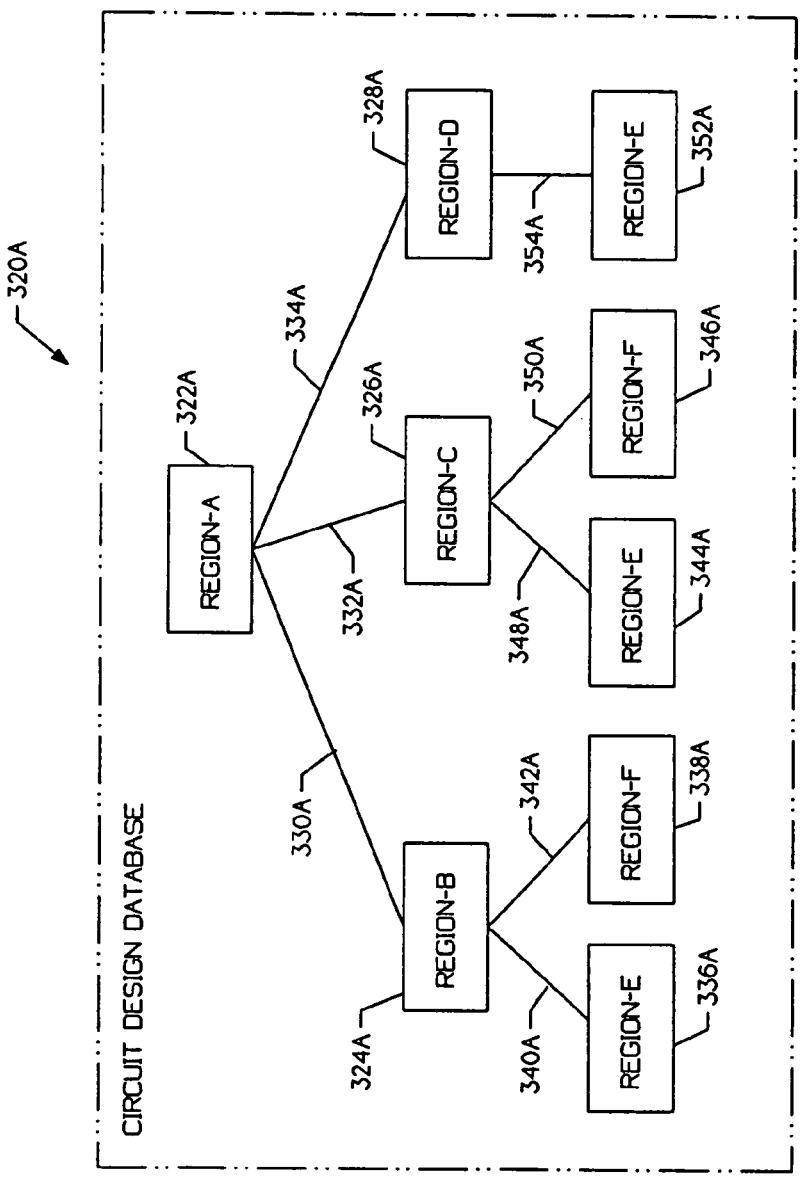
FIG. 6 is a block diagram showing a typical circuit design hierarchy, including a number of hierarchical circuit regions.

FIG. 6 is a block diagram showing a typical circuit design hierarchy, including a number of hierarchical circuit regions. The diagram is generally shown at 320A. A top level region-A 322A is provided, and may represent the top hierarchical level in the exemplary circuit design database. Region-A 322A may include references to region-B 324A, region-C 326A, and region-D 328A as shown at 330A, 332A and 334A, respectively. Region-B 324A, region-C 326A, and region-D 328A represent the next lower level of design hierarchy in the circuit design database.

Region-B 324A may include references to region-E 336A and region-F 338A as shown at 340A and 342A, respectively. Similarly, region-C 326A may include references to region-E 344A and region-F 346A, as shown at 348A and 350A, respectively. Finally, region-D 338A may include a reference to region-E 352A, as shown at 354A. Regions 336A, 338A, 344A, 346A and 352A represent the lowest level in the design hierarchy of the circuit design database, and may be "leaf cells". That is, regions 336A, 338A, 344A, 346A and 352A may be components from a vendor provided cell library.

It is noted that the same logic, for example region-E, may be represented by region-B 324A, region-C 326A, and region-D 328A. To distinguish region-E 336A, region-E 344A and region-E 352A from one another, a unique instance name may be provided, thereby allowing each region to be uniquely identified. Similarly, region-F 338A and region-F 346A may be provided with a unique instance name.

It is recognized that in practice, the circuit design database is typically much more complex, containing many more levels of design hierarchy and thousands of regions and/or cells. That is, the circuit design database shown in FIG. 6 is only presented to illustrate the basic structure of a typical circuit design database.

Figure 7:
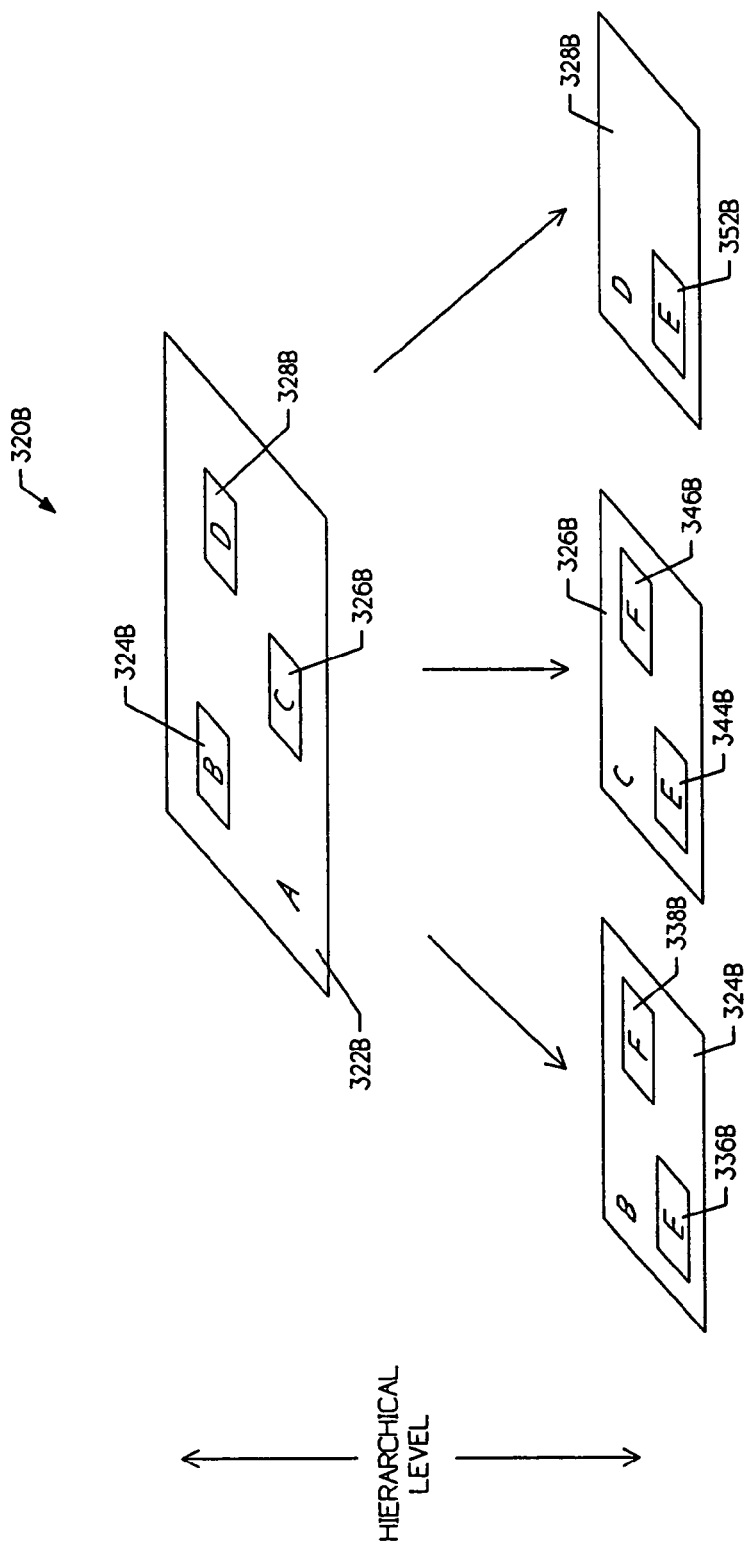
FIG. 7 is a block diagram showing a number of context environments for the circuit design hierarchy of FIG. 6.

FIG. 7 is a block diagram showing a number of context environments for the circuit design hierarchy of FIGS. 6–7. As indicated above, the present invention contemplates allowing the circuit designer to set a "context" as the current working environment of the floorplanning tool. Typically, the selected context corresponds to a region or cell within the circuit design database. For example, the circuit designer may elect to set the current context as corresponding to region-A 322B. In an exemplary embodiment, when the current context is set to a particular region, only those regions one level down in the design hierarchy are available for selection and placement. In this embodiment, only region-B 324B, region-C 326B and region-D 328B would be available for selection and placement.

Similarly, the circuit designer may elect to set the current context as corresponding to region-B 324B. As such, only region-E 336B and region-F 338B would be available for selection and placement. Setting the current context to region-C 326B may make only region-E 344B and region-F 346B available for selection and placement. Finally, setting the current context to region-D 328B may make only region-E 352B available for selection and placement. In this way, the environment of the floorplanning program may conform to the particular level of hierarchy, or context, set by the circuit designer.

Figure 8:
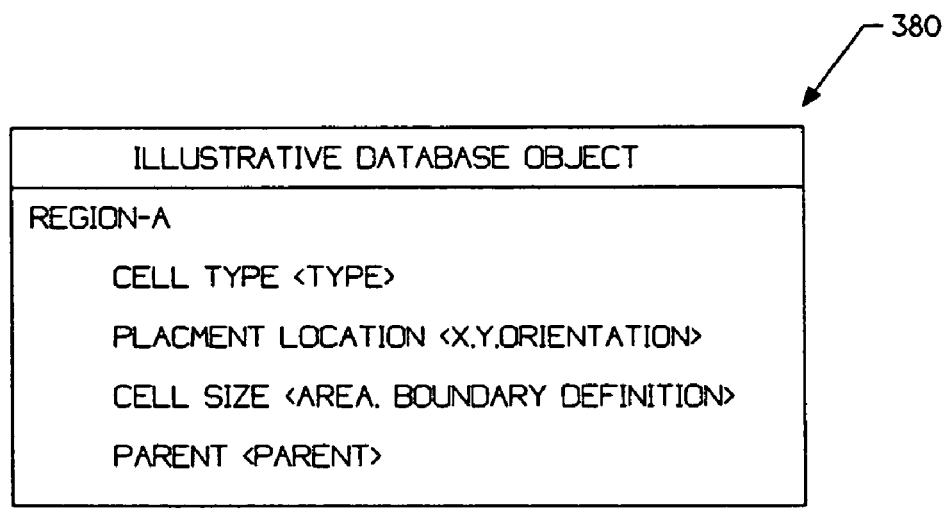
FIG. 8 is a table illustrating an object orientated data structure for Region-A of FIGS. 6–7.

FIG. 8 is a table illustrating an object orientated data structure for Region-A of FIGS. 6–7. In an illustrative embodiment, the circuit design database may be object orientated. That is, each cell or region may be included as a number of objects/variables within the circuit design database. The database object may be identified by a region name, for example, region-A as shown. This may be the instance name of the region. The database object may further include a number of objects that describe the object. For example, region-A may include a cell-type object which indicates the type of the cell (NAND2, OR2, REG, etc.). Region-A may further include a placement location object, including the X-Y coordinates and the placement orientation. In addition, region-A may include a cell size object, including the area of the region and the boundary definition. Finally, region-A may include a parent object pointer, which may indicate the parent of region-A within the overall design hierarchy. It should be understood that the objects shown in FIG. 8 are only illustrative, and that in a typical design database, many more objects may be stored for each region and/or cell.

Figure 9:
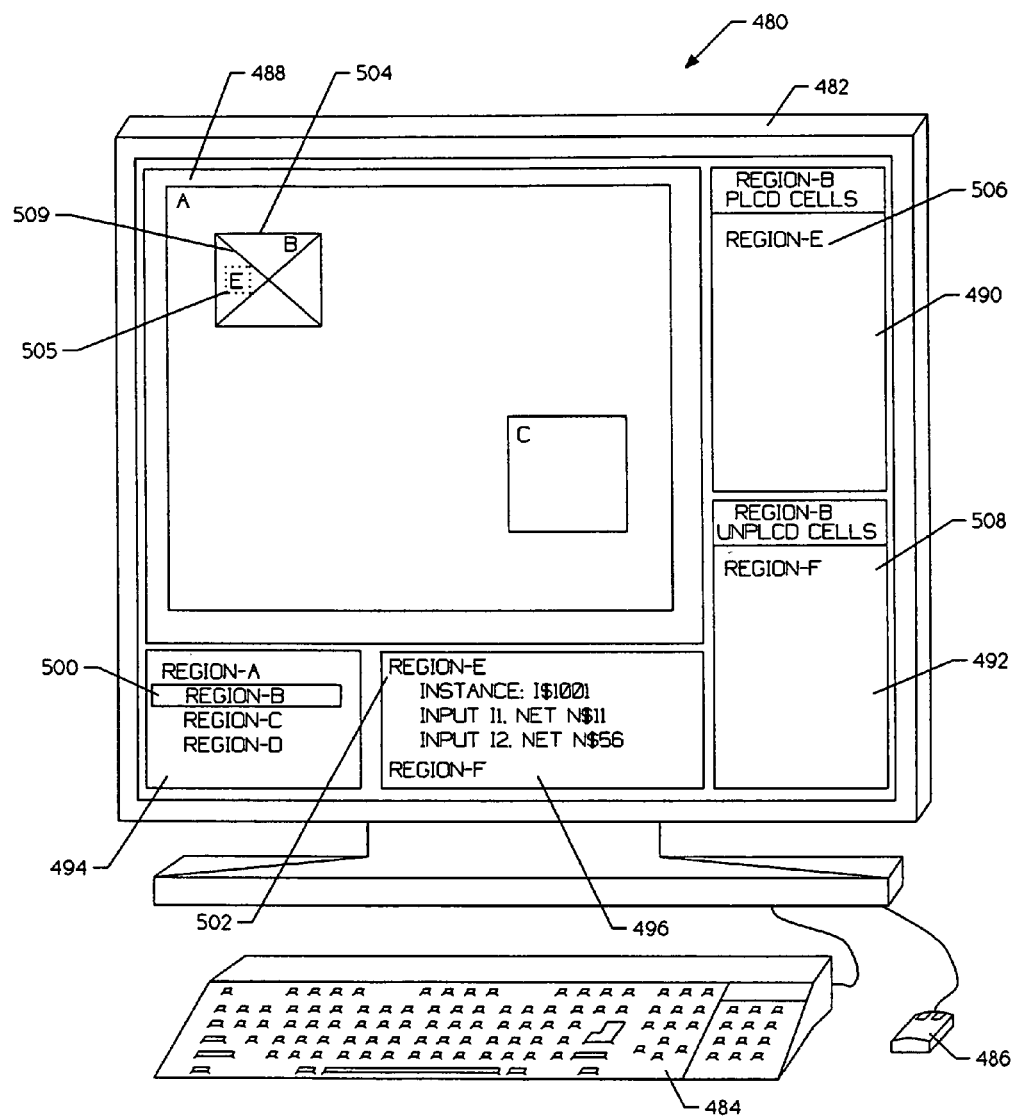
FIG. 9 is a block diagram of a data processing system executing a placement tool in accordance with the present invention.

FIG. 9 is a block diagram of a data processing system executing a floorplanning tool in accordance with the present invention. In a preferred embodiment, the data processing system 480 may include a display device 482, a keyboard 484 and a pointing device 486. A microprocessor or the like may be included in the display device 482 or in a separate unit (not shown).

The data processing system 480 may incorporate a floor-planning tool. The floorplanning tool may be implemented in either hardware or software. In a preferred embodiment, the floorplanning tool is implemented in software and executed on the data processing system 480.

The floorplanning tool may display a number of windows on the display device 482. In the example shown, these windows including a floorplanning window 488, two logical windows 494 and 496, and two physical windows 490 and 492. The floorplanning window displays a physical representation of the circuit design database, and in particular, displays those cells and/or regions that are placed on a scaled representation of an integrated circuit die.

A first logic window 494 may display a tree graph of the circuit design hierarchy. The circuit designer may scroll through the first logic window 494, and may identify particular regions therefrom. In the illustrative diagram, region-B has been identified, as shown at 500. In a preferred embodiment, only regions are displayed in the first logic window 494. Leaf cells are not displayed.

A second logic window 496 may display the leaf cells or regions within the region that is identified in the first logic window 494. For example, if region-B is identified in the first logic window 494 as shown at 500, the second logic window 496 may display the cells within region-B. In this case, the second logic window 496 displays region-E and region-F, as shown at 502. It is assumed for this example, that region-E and region-F are leaf cells, otherwise they would be displayed in the first logic window 494.

It is contemplated that the second logic window 496 may also display selected database objects for each of the cells or regions therein. Accordingly, the second logic window 496 may display the instance name, the input pin names along with the associated net names for each input pin, the output pin names along with the associated net names for each output pin name, etc. It is contemplated that any number of predefined database objects may be displayed for each of the cells within the circuit design.

The floorplanning tool may allow the circuit designer to set the current context in any number of ways. A first method is to identify a region or cell in the first logic window 494 or the second logic window 496, and hit a predefined set context key. For example, the circuit designer may identify region-B in the first logical window 494, as shown at 500. The designer may then hit the predefined set context key to set the current context to region-B. When a region is set as the current context, the placement tool may provide an "X" over the selected region in the floorplanning window 488, as shown at 509. This provides a visual indication of the current context. Further, the physical windows 490 and 492 may indicate the current context in the title bar thereof, as shown.

Another method for selecting a current context is to select a region in the floorplanning window, and then hit the predefined set context key. Yet another method is to select a region or cell from one of the physical windows (see below), and hit the predefined set context key. In general, after any cell or region is selected or identified in any manner, the circuit designer may set the current context to the selected cell or region by hitting the predefined set context key. It is recognized that the above-described methods for setting the current context are only exemplary, and that many other methods are contemplated.

A first physical window 492 may display all unplaced cells within the current context. Similarly, a second physical window 490 may display all placed cells within the current context. In a preferred embodiment, the current name of the region or cell that is set as the current context is displayed in the title bar of each of the first and second physical windows. In the illustrative embodiment shown in FIG. 8, region-B is set as the current context, and thus the title bar above the first and second physical windows displays the name "region-B", as shown.

The floorplanning window 488 displays a number of placed cells. In the present example, region-A, region-B, region-C, and region-E are displayed. For illustrative purposes, it is assumed that the placement tool is operating on the circuit design database shown in FIGS. 5–6. As indicated above, region-B is selected as the current context. Thus, the second logic window displays the cells therein, including leaf cells region-E 502 and regions-F (partially shown), and selected database objects therefor.

Region-E is also displayed in the second physical window 490, as shown at 506, because region-E is already placed in the floorplanning window 488, as shown at 505. Region-F, on the other hand, is displayed in the first physical window 492, as shown at 508, because region-F remains unplaced in the floorplanning window 488.

During the placement of a circuit design database, the circuit designer may scroll through the first physical window 492 and set a selected region or cell as the current context (by hitting the predefined set context key). Once selected, the children of the selected region may be displayed in the first and second physical windows 490 and 292. The children of the selected region are referred to as the active regions and cells within the current context. The placed active regions and cells are displayed in the second physical window 490 and the un-placed active regions and cells are displayed in the first physical window 492. The circuit designer may then select an un-placed region or cell from the first physical window 492. The floorplanning tool may then load a physical representation of the selected region or cell, and the circuit designer may place the physical representation of the region or cell in the floorplanning window 488. The floorplanning tool may then move the region or cell from the first physical window 492 to the second physical window 490. The first and second logic windows 494 and 496 are updated when the selection is changed in the floorplanning window 488, the first physical window 492 or the second physical window 490.

It is recognized that the circuit design database may be much more complex and contain many more levels of hierarchy than is shown in the simple example of FIG. 8. In a typical circuit design database, large contexts often contain thousands of regions and/or cells, and thus the first and second physical windows typically display many more objects.

Figure 10:
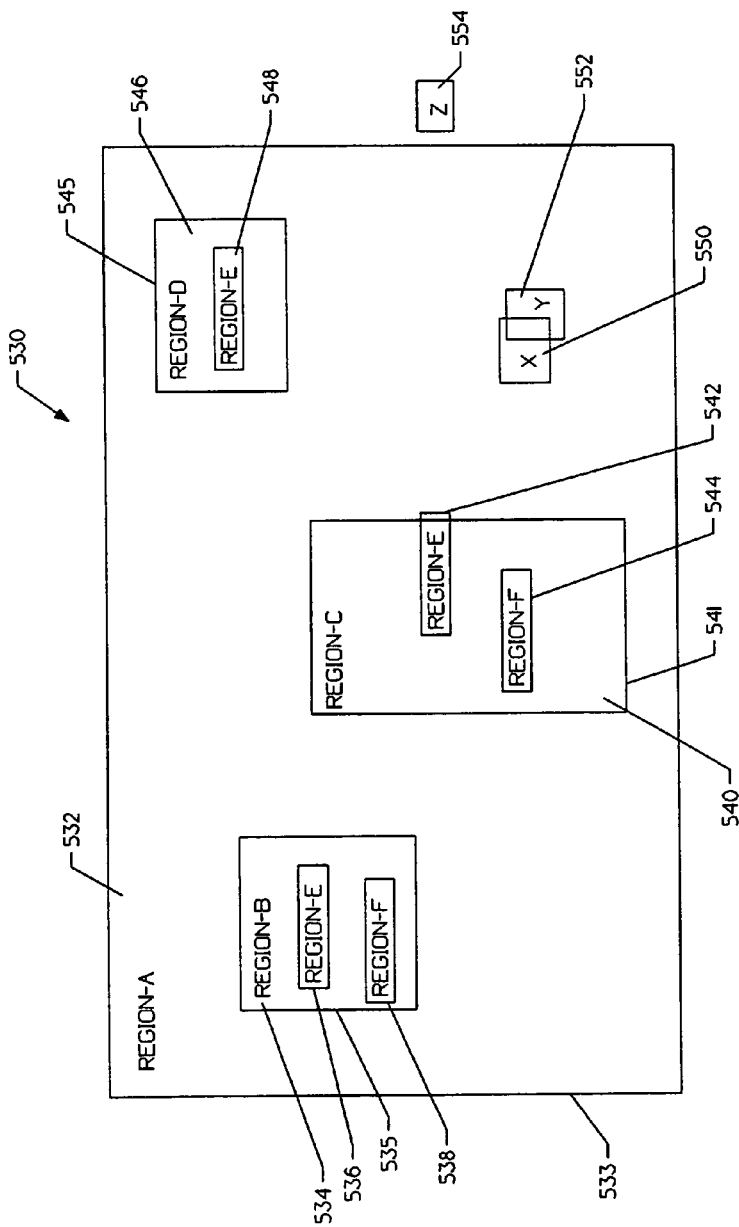
FIG. 10 is a top view of a partially placed integrated circuit die, having a number of physical errors therein.

FIG. 10 is a top view of a partially placed integrated circuit die, having a number of physical errors therein. The diagram is generally shown at 530. Region-A is placed as shown at 532. Region-B 534, region-C 540 and region-D 546 are placed within the outer placement boundary 533 of region-A 532. Likewise, region-E 536 and region-F 538 are placed within the outer placement boundary 535 of region-B 535. Similarly, region-E 548 is placed within the outer placement boundary 545 of region-D 546. Finally, region-F 544 is placed within the outer placement boundary 541 of region-C 540.

In accordance with a preferred embodiment of the present invention, the placement tool may include a physical violations checking feature to identify physical violations in the placement database. The physical violations checking feature may assemble a listing of cells that are involved in physical violations and provide that list as a cell selection list.

The physical violation checking feature of a preferred embodiment of the present invention is described in U.S. patent application Ser. No. 08/789,024, filed Jan. 27, 1997, entitled "Method and Apparatus for Identifying Physical Errors in a Placement Database". Described therein are a number of physical checks that may be provided by a floorplanning tool, including object overlap checks, object out-of-bounds checks, and object out-of-context checks. A number of other checks are disclosed, but are not illustrated here.

Referring to FIG. 10, region-E 542 is not placed entirely within the outer placement boundary 541 of region-C 540, which is allowed. Referring to FIGS. 6–7, region-E 542 is a child of region-C 540, and generally should be placed within the outer placement boundary 541 of region-C 540.

The object out-of-context check may identify objects (e.g. cells or regions) that are placed outside of their corresponding "context". For this invention, a context may be considered a hierarchical object, and may include all lower-level cells in the design hierarchy. An outer placement boundary may be defined for each of the hierarchical objects, as shown. Further, the placement region is appropriately sized to accommodate the placement of all lower-level cells associated therewith. Thus, when one of the selected hierarchical objects is manually placed, the placement region may allow sufficient die space for the placement of all lower-level cells therein. This may facilitate the automatic place and route of all lower-level cells associated with the higher-level object.

Generally, all lower-level cells are placed within the outer placement boundary of the corresponding higher-level object. However, circuit designers may elect to over-ride this default condition. For example, region-E may be removed from the region-C context, and added to the region-A context. That is, the circuit designer may place a lower-level cell outside of the context of the corresponding higher-level object. Thus, in a preferred embodiment, the floorplanning tool may identify all objects that are placed "out-of-context", and may provide a listing of those objects to a cell selection list. In the illustrated embodiment of FIG. 10, the floorplanning tool say identify region-E 542 as being placed "out-of-context", and may list region-E 542 in a cell selection list.

Another approach for out-of-context checking is to check whether a particular cell is moved from the logical context from which it originated. A "context" may be considered a logical hierarchical level in the logical database. The placement database may have a similar hierarchical structure. However, in a preferred floorplanning tool, a cell or region may be moved from its parent in the placement database to another location in the hierarchical structure. When this occurs, the hierarchical structure of the placement database may no longer match the hierarchical structure of the logical database. This moved cell is then called "out-of-context". The out-of-context check may check for this type of situation and may warn the user thereof.

In addition, region-X 550 and region-Y 552 overlap one another. The object overlap check described in U.S. patent application Ser. No. 08/789,024, filed Jan. 27, 1997, entitled "Method and Apparatus for Identifying Physical Errors in a Placement Database" may identify region-X 550 and region-Y 552 as overlapping cells, and may list region-X 550 and region-Y 552 in the cell selection list.

Finally, region-Z 554 is placed outside of the boundary defining the integrated circuit die. The object out-of-bounds check described in U.S. patent application Ser. No. 08/789,024, filed Jan. 27, 1997, entitled "Method and Apparatus for Identifying Physical Errors in a Placement Database" may identify region-Z 554 as being placed outside of the boundary defining the integrated circuit die, and may list region-Z 554 in the cell selection list. This illustrates one of several methods of generating a cell selection list in accordance with the present invention.

Figure 11:
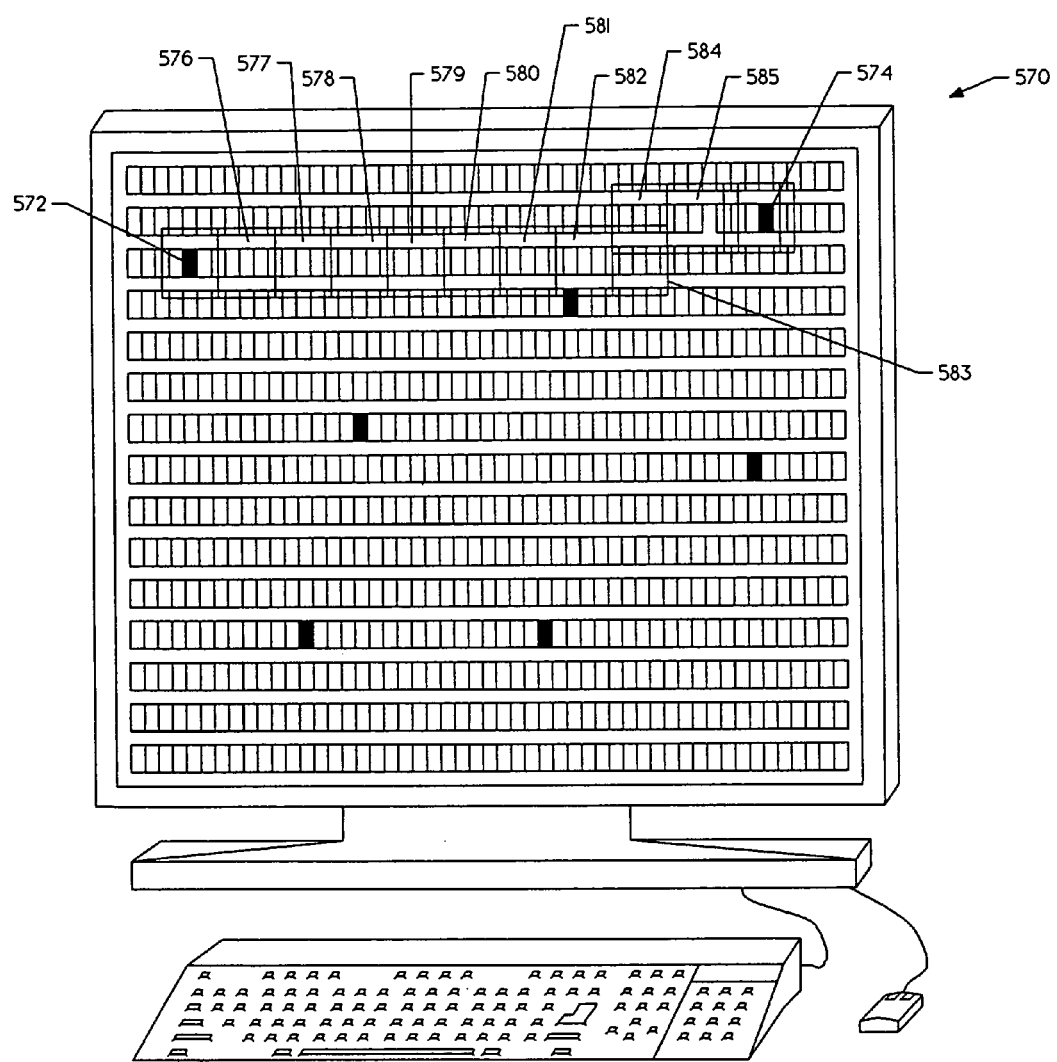
FIG. 11 is a side perspective view of a data processing system executing a placement tool, showing a prior art method for viewing selected placed cells.

FIG. 11 is a side perspective view of a data processing system executing a placement tool, showing a prior art method for viewing selected placed cells. The diagram is generally shown at 570. As indicated in the BACKGROUND OF THE INVENTION, it may be important to view specific pre-identified cells or components. This may be particularly helpful to view those cells that are involved in the detected errors (see FIG. 10).

In prior art database editor tools, viewing specific pre-identified cells was often tedious and time-consuming because there was not an efficient method for locating and viewing the pre-identified cells. For example, suppose the circuit designer wishes to view pre-identified cells 572 and 574. In prior art schemes, the circuit designer would often manually locate the cells by panning through the design using the database editor's graphics window. That is, the circuit designer may establish a view frame 576 around cell 572, and then pan across the circuit design as shown at 577–585, until cell 574 was displayed. It is recognized that the circuit designer may zoom out to view the entire circuit design and then zoom in to view a particular cell. However, even using this method, the exact location of the pre-identified cell may not be precisely known. Further, even if the exact location of the a cell was known, navigating to that location by viewing the entire circuit design could be slow, particularly since the graphics terminal may be manipulating files that contained tens of thousands of objects.

Finally, in prior art database editor tools, once a cell is found, the database editor is typically not set to the proper level in the design hierarchy to immediately allow an editing function on the cell or surrounding circuitry.

Figure 12:
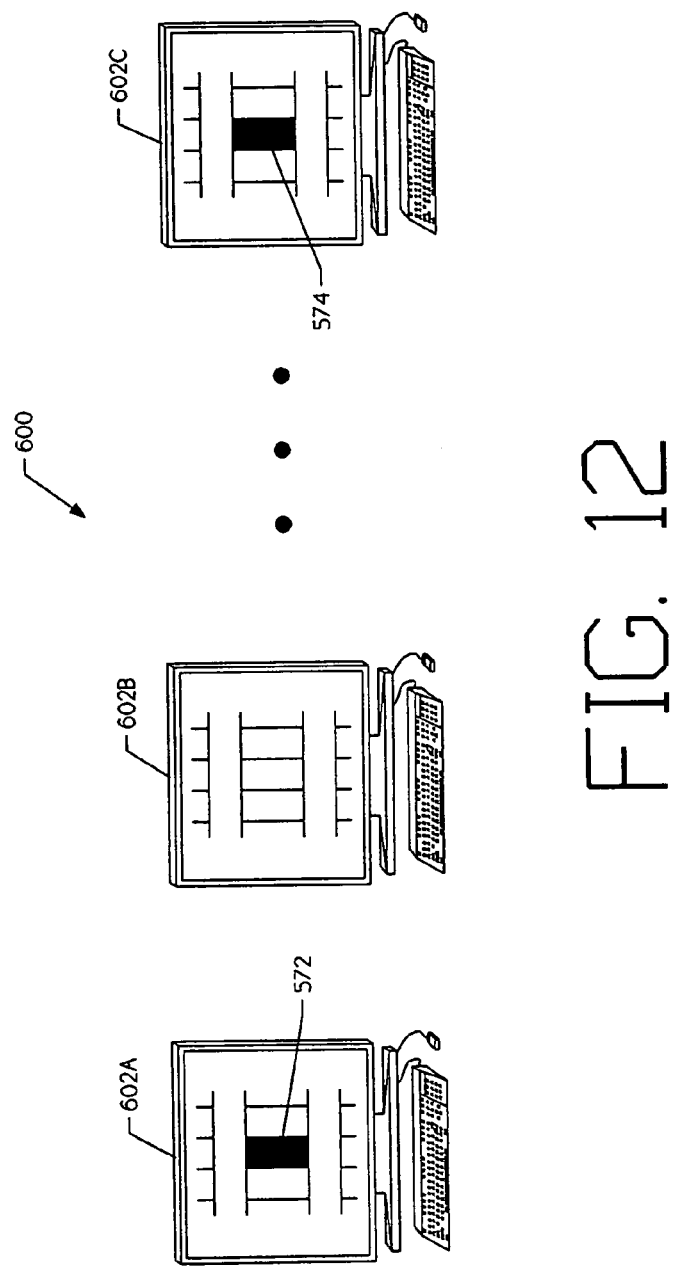
FIG. 12 is a side perspective view of a data processing system executing a placement tool, showing a typical display after each pan operation during the prior art method illustrated in FIG. 11.

FIG. 12 is a side perspective view of a data processing system executing a placement tool, showing a typical display after each pan operation during the prior art method illustrated in FIG. 11. As indicated above, in prior art database editor tools, viewing specific pre-identified cells was often tedious and time-consuming because there was not an efficient method for locating and viewing the pre-identified cells. Suppose a circuit designer wished to view pre-identified cells 572 and 574 (see also FIG. 11). The circuit designer would first establish a view frame around cell 572 as shown. Thereafter, the circuit designer would manually locate the cells by panning through the design using the database editor's graphics window, as shown at 602A, 602B and 602C.

It is recognized that the circuit designer may zoom out to view the entire circuit design and then zoom in to view a pre-identified cell. However, even when using this method, the exact location of the pre-identified cell may not be precisely known. Further, even if the exact location of the a cell was known, navigating to that location by viewing the entire circuit design could be slow, particularly since the graphics terminal may be manipulating files that contained tens of thousands of objects.

Finally, in prior art database editor tools, once the cells was found, the database editor was typically not set to the proper level in the design hierarchy to immediately allow an editing function on the cell or surrounding circuitry.

Figure 13:
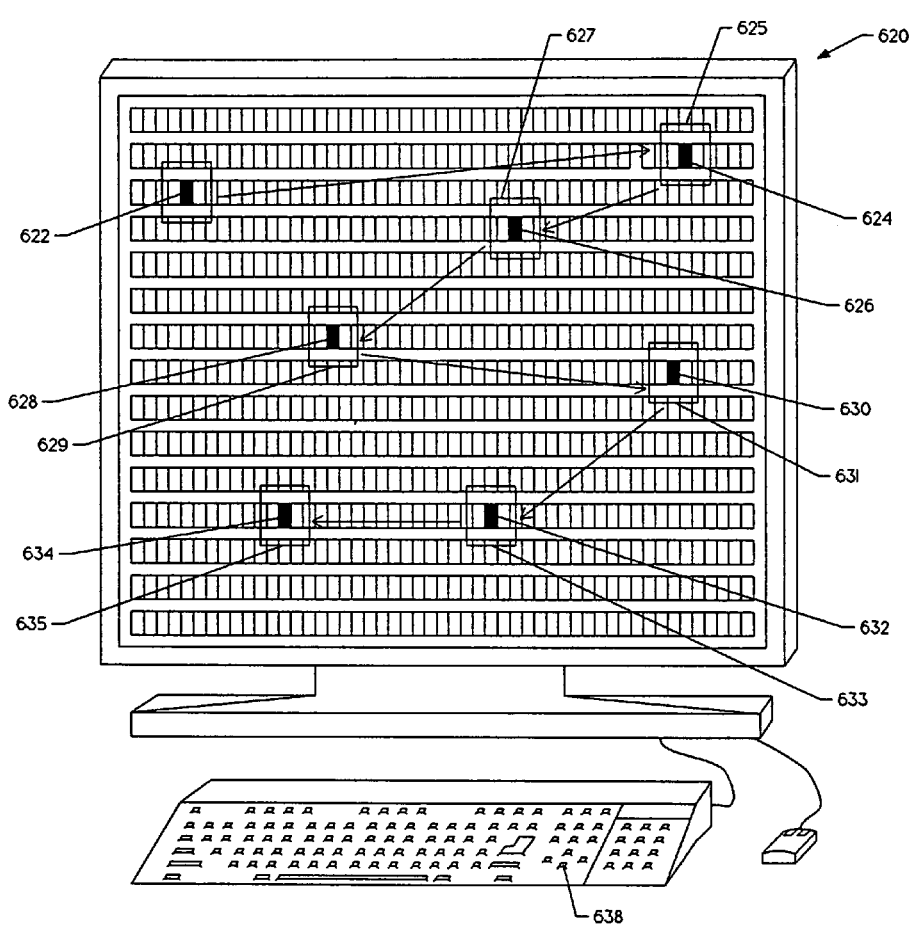
FIG. 13 is a side perspective view of a data processing system executing a placement tool, showing an exemplary method for viewing selected placed cells in accordance with the present invention.

FIG. 13 is a side perspective view of a data processing system executing a floorplanning tool, showing an exemplary method for viewing selected placed cells in accordance with the present invention. The diagram is generally shown at 620. A number of pre-identified cells are shown at 622, 624, 626, 628, 630, 632 and 634. In a preferred embodiment, the pre-identified cells are identified in a cell selection list which is read by the placement tool.

In contrast to the method illustrated in FIGS. 11–12, the present invention allows the circuit designer to sequentially establish a view frame around each of the pre-identified cells, as shown at 625, 627, 629, 631, 633 and 635, by hitting a number of pre-defined "hot-keys". In the illustrative embodiment, the pre-defined hot-key is the down arrow key, as shown at 638.

It is contemplated that the view frame may include a portion of the circuit design that is immediately surrounding the cell that is currently being viewed. Further, the placement tool may display the first cell in the cell selection list, for example cell 622, either automatically upon reading the cell selection list or only after being initiated by the circuit designer. If initiated by the circuit designer, the circuit designer may first select a cell other than the first cell from the cell selection list for viewing. In addition, the placement tool may allow the circuit designer to specify how much of the circuit design surrounding each of the cells is displayed in the view frame.

It is further contemplated that after a view frame is established, the circuit designer may edit the cell and/or the surrounding circuit design, as desired. To aid the circuit designer, the present invention may automatically set the design hierarchy in the placement tool to an appropriate context level, so that the cell that is currently viewed can be easily manipulated by the circuit designer. In a preferred embodiment, the hierarchical context level may be set at or above the level of hierarchy of the cell currently being viewed (see FIGS. 6–7).

The circuit designer may continue to hit the number of pre-defined "hot-keys" to view succeeding cells listed in the cell selection list. If the circuit designer hits the number of pre-defined "hot keys" after the last cell in the cell selection list is viewed, it is contemplated that the database editor may wrap around and again view the first cell listed in the cell selection list.

Finally, it is contemplated that the cell selection list may identify nets (not shown) as well as cells or components for viewing. That is, it may be desirable to view a specific net within the circuit design database, for example, a net involved in a timing violation. Thus, both cells and nets may be listed in the cell selection list.

It is recognized that any database editor tool may be used or adopted to be used in accordance with the present invention. Some examples of database editor tools that may be used include a schematic entry tool, a simulation tool, a floorplanning tool, a place and route tool, or any other tool that allows the circuit designer to view a representation of the circuit design. As indicated above, and in a preferred embodiment, the database editor tool is a placement (e.g. floorplanning) tool.

Figure 14:
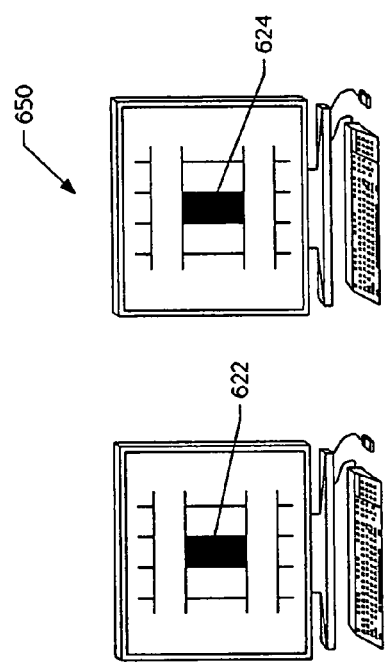
FIG. 14 is a side perspective view of a data processing system executing a placement tool, showing a typical display after each "hot-key" operation for the method illustrated in FIG. 13.

FIG. 14 is a side perspective view of a data processing system executing a placement tool, showing a typical display after each "hot-key" operation for the method illustrated in FIG. 13. The diagram is generally shown at 650. After a cell selection list is read into the floorplanning tool, the circuit designer may hit a number of pre-defined "hot-keys" to establish a view frame around a selected cells. For example, the circuit designer may establish a view frame around cell 622, as shown (see also FIG. 13). Thereafter, the circuit designer may hit the number of pre-defined "hot-keys", and the placement tool may immediately establish a view frame around the next succeeding cell in the cell selection list, in this case cell 624. The floorplanning tool may determine the x-coordinates of the next succeeding cell by querying the placement location object associated therewith (see, FIG. 8). Unlike the prior art, the present invention does not require the circuit designer to navigate through the circuit design using panning or zooming functions to establish the next desired view frame. Preferably, hitting a hot key other than the cell selection hot key causes algorithms described in FIGS. 15–17 to exit.

Figure 15:
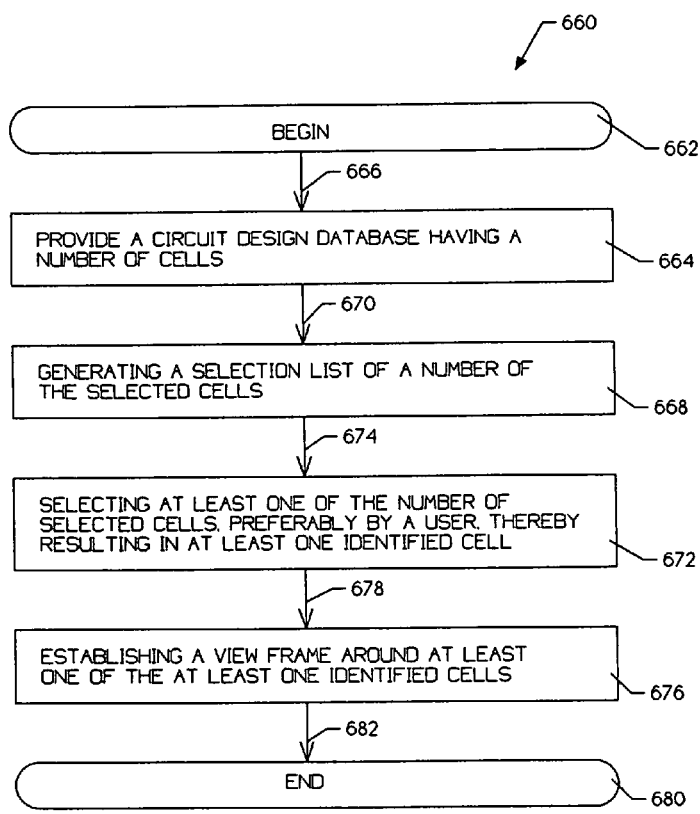
FIG. 15 is a flow diagram illustrating a first exemplary method of the present invention.

FIG. 15 is a flow diagram illustrating a first exemplary method of the present invention. The algorithm is generally shown at 660, and is entered at element 662. Control is passed to element 664 via interface 666. Element 664 provides a circuit design database having a number of cells therein. Control is then passed to element 668 via interface 670. Element 668 either generates or reads from an external source a selection list of a number of the selected cells. Control is then passed to element 672 via interface 674. Element 672 selects at least one of the number of selected cells, preferably by a user, thereby resulting in at least one identified cell. Control is then passed to element 676 via interface 678. Element 676 establishes a view frame around at least one of the at least one identified cells. Control is then passed to element 680 via interface 682, wherein the algorithm is exited.

Figure 16:
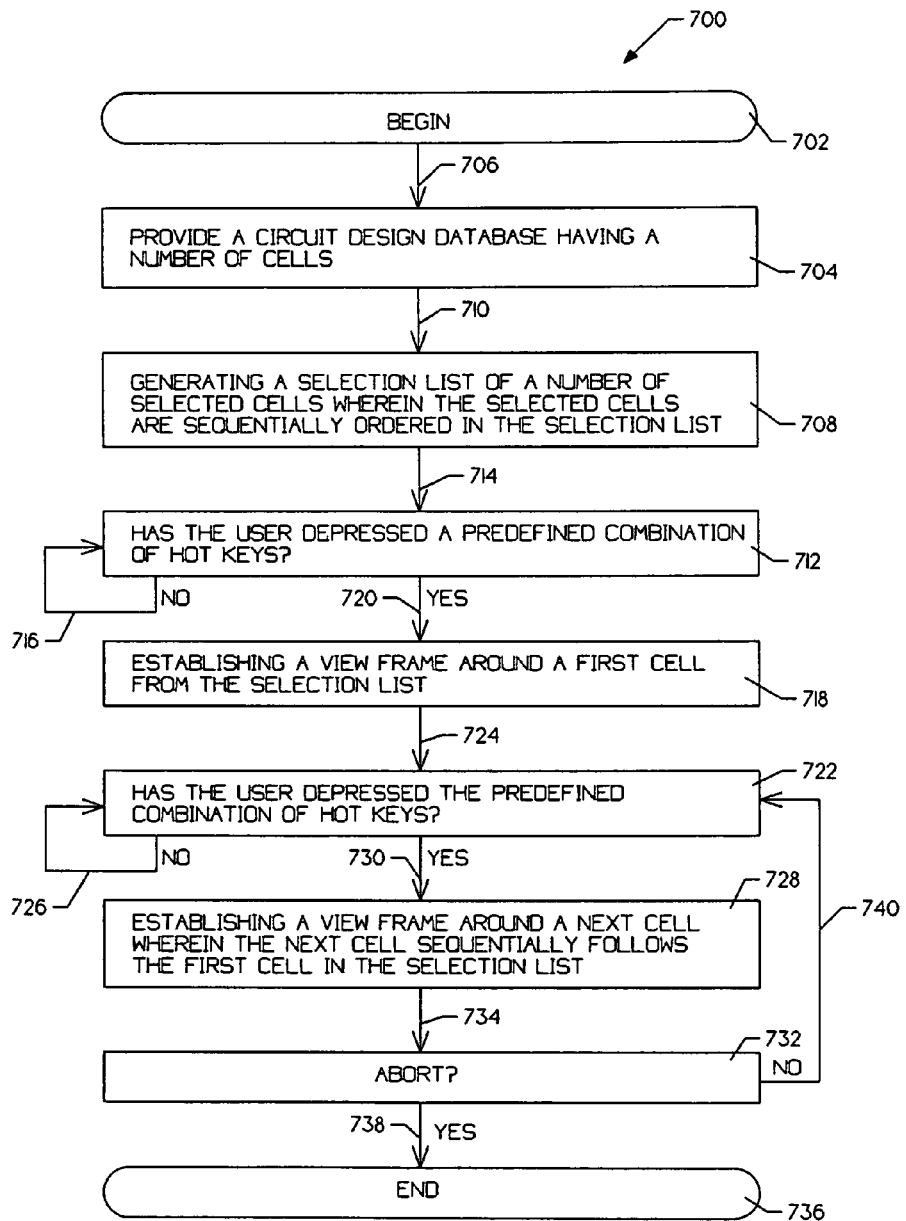
FIG. 16 is a flow diagram illustrating a second exemplary method of the present invention.

FIG. 16 is a flow diagram illustrating a second exemplary method of the present invention. The algorithm is generally shown at 700, and is entered at element 702. Control is passed to element 704 via interface 706. Element 704 provides a circuit design database having a number of cells therein. Control is then passed to element 708 via interface 710. Element 708 generates a selection list of a number of selected cells, wherein the selected cells are sequentially ordered in the selection list. Control is then passed to element 712 via interface 714. Element 712 determines whether the user has depressed a predefined combination of hot keys. If the user has not depressed the predefined combination of hot keys, control is passed back to element 712 via interface 716. If, however, the user has depressed a predefined combination of hot keys, control is passed to element 718 via interface 720. Element 718 establishes a view frame around a first cell from the selection list. Control is then passed to element 722 via interface 724. Element 722 determines whether the user has depressed the predefined combination of hot keys. If the user has not depressed the predefined combination of hot keys, control is passed back to element 722 via interface 726. If, however, the user has depressed the predefined combination of hot keys, control is passed to element 728 via interface 730. Element 728 establishes a view frame around a next cell, wherein the next cell sequentially follows the first cell in the selection list. Control is then passed to element 732 via interface 734. Element 732 determines whether an abort has been detected. If an abort has not been detected, control is passed back to element 722 via interface 740. However, if an abort has been detected, control is passed to element 736 via interface 738, wherein the algorithm is exited.

Figure 17A:
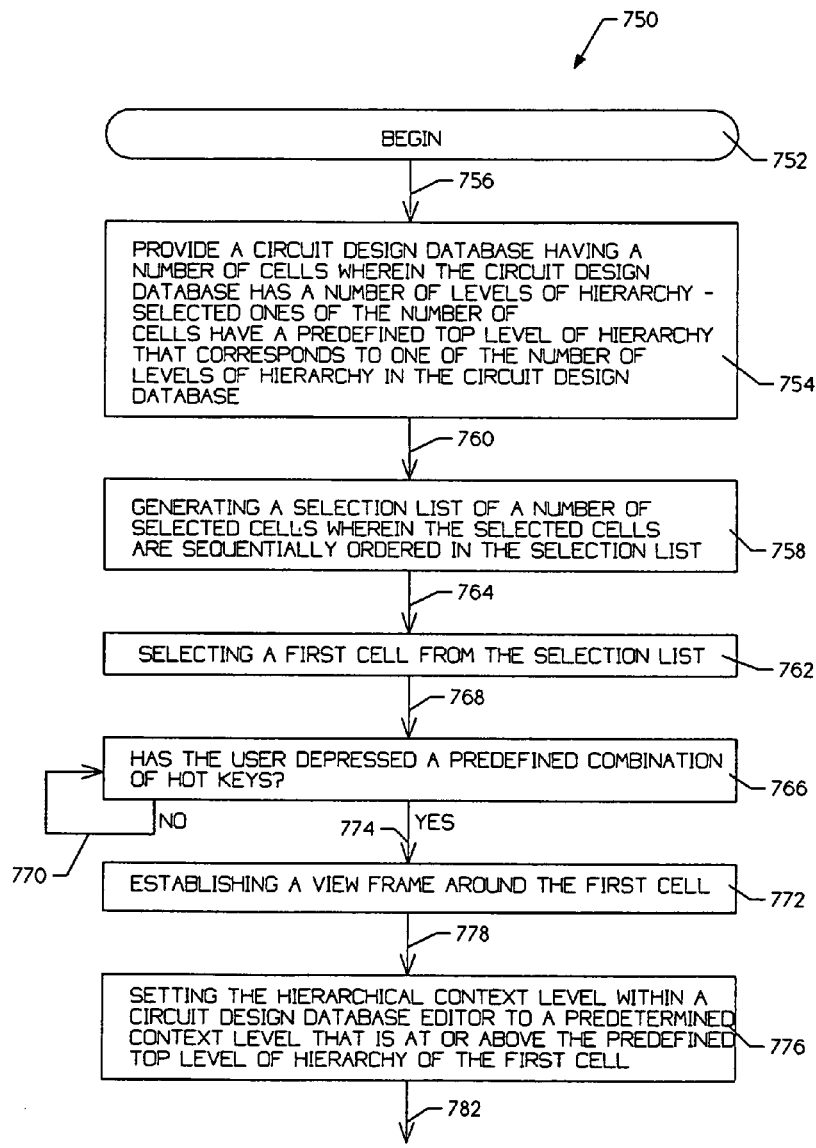
FIGS. 17A–17B are a flow diagram illustrating a third exemplary method of the present invention.
Figure 17B:
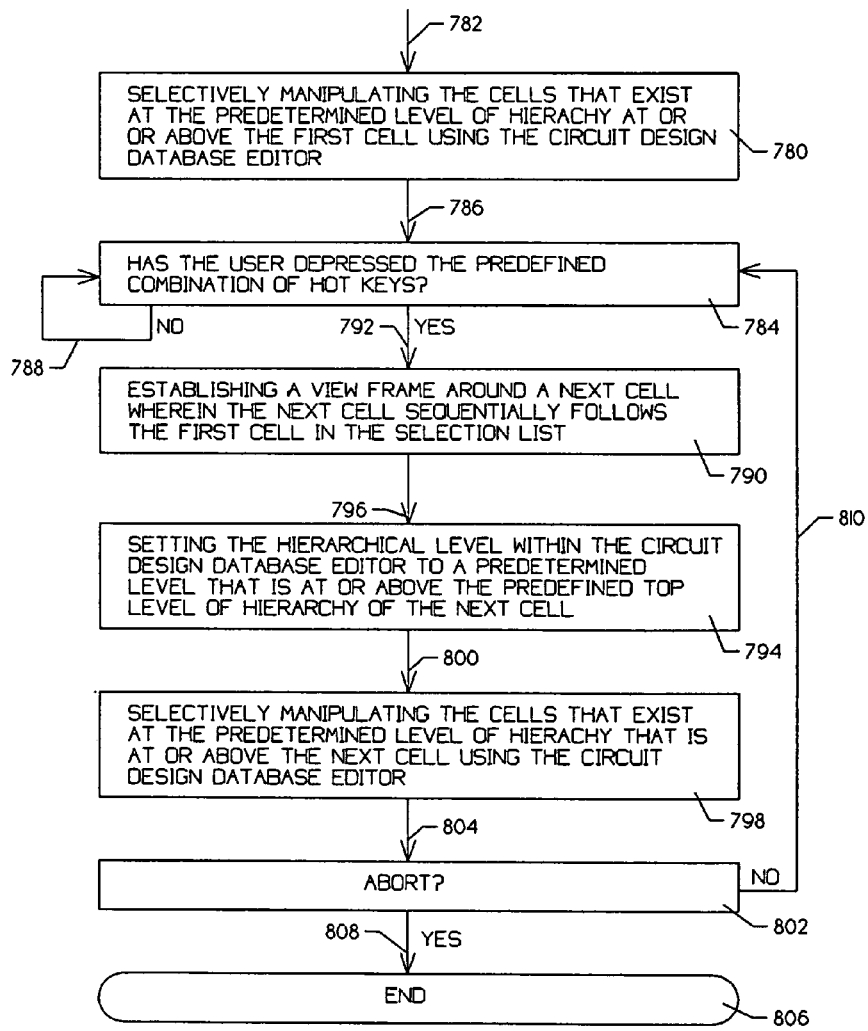

FIGS. 17A–17B are a flow diagram illustrating a third exemplary method of the present invention. The algorithm is generally shown at 750, and is entered at element 752. Control is passed to element 754 via interface 756. Element 754 provides a circuit design database having a number of cells therein, wherein the circuit design database has a number of levels of hierarchy. Selected ones of the number of cells have a predefined level of hierarchy that corresponds to one of the number of levels of hierarchy in the circuit design database. Control is then passed to element 758 via interface 760. Element 758 generates a selection list of a number of selected cells, wherein the selected cells are sequentially ordered in the cell selection list. Control is then passed to element 762 via interface 764. Element 762 selects a first cell from the selection list. Control is then passed to element 766 via interface 768. Element 766 determines whether the user has depressed a predefined combination of hot keys. If the user has not depressed the predefined combination of hot keys, control is passed back to element 766 via interface 770. However, if the user has depressed the predefined combination of hot keys, control is passed to element 772 via interface 774. Element 772 establishes a view frame around the first cell. Control is then passed to element 776 via interface 778. Element 776 sets the hierarchical context level within a circuit design database editor to a predetermined level that is at or above the predefined level of hierarchy of the first cell. Control is then passed to element 780 via interface 782. Element 780 selectively manipulates the cells that exist at the predetermined level of hierarchy that is at or above the first cell, using the circuit design database editor. Preferably, this step is optional and may be provided by a circuit designer. Control is then passed to element 784 via interface 786. Element 784 determines whether the user has depressed the predefined combination of hot keys. If the user has not depressed the predefined combination of hot keys, control is passed back to element 784 via interface 788. If, however, the user has depressed the predefined combination of hot keys, control is passed to element 790 via interface 792. Element 790 establishes a view frame around a next cell, wherein the next sequentially follows the first cell in the selection list. Control is then passed to element 794 via interface 796. Element 794 sets the hierarchical context level within the circuit design database editor to a predetermined level that is at or above the predefined top level of hierarchy of the next cell. Control is then passed to element 798 via interface 800. Element 798 selectively manipulates the cells that exist at the predetermined level of hierarchy that is at or above the next cell, using the circuit design database editor. Like element 780, this step may be optional and may be provided by a circuit designer. Control is then passed to element 802 via interface 804. Element 802 determines whether an abort has been detected. If an abort has not been detected, control is passed back to element 784 via interface 810. However, if an abort has been detected, control is passed to element 806 via interface 808, wherein the algorithm is exited.

Having thus described the preferred embodiments of the present invention, those of skill in the art will readily appreciate that the teachings found herein may be applied to yet other embodiments within the scope of the claims hereto attached.

We claim:

1. A method for displaying a number of selected cells on a cathode ray tube, wherein the number of selected cells are represented in a circuit design database, the method comprising the steps of:
   a. generating a selection list of the selected cells;
   b. selecting at least one of the selected cells; and
   c. establishing a view frame around the at least one of the selected cells selected in step (b) by depressing a number of predefined hot keys.

2. A method according to claim 1 further comprising the step of receiving a number of user defined display options, wherein the user defined display options determine the display of the circuit design database in the established view frame.

3. A method according to claim 1 wherein said establishing step sequentially establishes a view frame around selected cells in the selection list when the number of hot key(s) are sequentially depressed.

4. A method according to claim 1 further comprising the step of selectively editing the circuit design database after the view frame is established.

5. A method according to claim 4 wherein the circuit design database includes a number of levels of hierarchy, and wherein each of the selected cells has a predefined top level of hierarchy that corresponds to one of the number of levels of hierarchy in the circuit design database.

6. A method according to claim 5 wherein said establishing step includes the step of setting the hierarchical level, within a circuit design database editor, to a predetermined level that is at or above the predefined top level of hierarchy of the corresponding cell(s) when said establishing step establishes a view frame therearound.

7. A method according to claim 6 wherein said circuit design database is a physical design database representing a physical design of the circuit design.

8. A method according to claim 7 wherein said physical design database is a placement design database, representing a placement of predefined cells of the circuit design database.

9. A method according to claim 1 wherein said circuit design database is a schematic design database representing a schematic representation of the circuit design.

10. A method according to claim 1 wherein said circuit design database is a simulation design database.

11. A method according to claim 1 wherein said generating step includes a physical violation checking step for identifying a number of physical violations in the circuit design database, and for identifying selected ones of the number of cells that caused selected ones of the number of physical violations.

12. A method according to claim 11 wherein said physical violations checking step checks for cell overlaps.

13. A method according to claim 11 wherein said physical violations checking step checks for parking lot violations.

14. A method according to claim 11 wherein said physical violations checking step checks for off-grid errors.

15. A method according to claim 11 wherein said physical violations checking step checks for out-of-context cells.

16. A method according to claim 11 wherein said generating step includes a timing violation checking step for identifying a number of timing violations in the circuit design, and for identifying selected ones of the number of cells that should be substituted with logically equivalent cells having a different drive strength to minimize the number of timing violations.

17. A method for sequentially viewing a number of selected cells, wherein the number of selected cells are represented in a circuit design database, the method comprising the steps of:
   a. generating a selection list of the selected cells, wherein the selected cells are sequentially ordered in the selection list;
   b. establishing a view frame around a first cell selected from the selection list when a predefined combination of hot keys are depressed; and c. establishing a view frame around a next cell wherein the next cell sequentially follows the first cell in the selection list when the predefined combination of hot keys is again depressed.

18. A method according to claim 17 wherein step (c) is repeated until the remaining cells in the selection list have each had a view frame established therearound.

19. A method according to claim 17 further comprising the step of selectively editing the circuit design database after the view frame has been established around the first cell.

20. A method according to claim 19 further comprising the step of selectively editing the circuit design database after the view frame has been established around the next cell.

21. A method according to claim 19 wherein the circuit design database includes a number of levels of hierarchy, and wherein each of the number of selected cells has a predefined top level of hierarchy that corresponds to one of the number of levels of hierarchy in the circuit design database.

22. A method according to claim 21 further comprising the step of setting the hierarchical level to a predetermined level that is at or above the predefined top level of hierarchy of the first cell when said view frame is established therearound.

23. A method for sequentially viewing a number of selected cells, wherein the number of selected cells are represented in a circuit design database, the method comprising the steps of:
  a. generating a selection list of the selected cells, wherein the selected cells are sequentially ordered in the selection list;
  b. selecting a first cell from the selection list;
  c. establishing a view frame around the first cell when a predefined combination of hot keys are depressed; and
  d. establishing a view frame around a next cells wherein the next cell sequentially follows the first cell in the selection list when the predefined combination of hot keys is again depressed.

24. In a data processing system for designing a circuit design, wherein the circuit design is represented in a circuit design database including a number of cells, the improvement comprising:
  a. cell selection list generating means for generating a list of selected ones of the number of cells included in the circuit design database;
  b. viewing means coupled to said cell selection list generating means for establishing a view frame around at least one of the selected cells; and
  c. user control means coupled to said viewing means for allowing a user to control around which of the selected cells that the view frame is established.

25. A data processing system according to claim 24 wherein said viewing means views the circuit design database according to a number of user defined display options.

26. A data processing system according to claim 24 wherein said user control means includes a hot key means, wherein the hot key means establishes the view frame around selected ones of the selected cells each time the hot key means is activated.

27. A data processing system according to claim 26 wherein said hot key mean is activated by depressing a number of predefined hot key(s).

28. A data processing system according to claim 24 further comprising a circuit design database editor for editing the circuit design database.

29. A data processing system according to claim 28 wherein the circuit design database includes a number of levels of hierarchy, and wherein each of the selected cells has a predefined top level of hierarchy that corresponds to one of the number of levels of hierarchy in the circuit design database.

30. A data processing system according to claim 29 wherein said circuit design database editor allows a user to modify the placement of a selected cell within the circuit design database when the level of hierarchy is set, within the circuit design database editor, to at or above the predefined top level of hierarchy for the selected cell.

31. A data processing system according to claim 30 further comprising a hierarchy control means coupled to said viewing means for setting the hierarchical level, within the circuit design database editor, to a predetermined level that is at or above the predefined top level of hierarchy of the corresponding cell when said viewing means establishes a view frame therearound.

32. A data processing system according to claim 31 wherein said circuit design database is a physical design database representing a physical design of the circuit design.

33. A data processing system according to claim 32 wherein said physical design database is a placement design database, representing a placement of predefined cells of the circuit design database.

34. A data processing system according to claim 24 wherein said circuit design database is a schematic design database representing a schematic representation of the circuit design.

35. A data processing system according to claim 24 wherein said circuit design database is a simulation design database.

36. A data processing system according to claim 24 wherein said cell selection list generating means includes a physical violation checking means for identifying a number of physical violations in the circuit design database, and for identifying selected ones of the number of cells that caused selected ones of the number of physical violations.

37. A data processing system according to claim 36 wherein said physical violations checking means checks for cell overlaps.

38. A data processing system according to claim 36 wherein said physical violations checking means checks for parking lot violations.

39. A data processing system according to claim 36 wherein said physical violations checking means checks for off-grid errors.

40. A data processing system according to claim 36 wherein said physical violations checking means checks for out-of-context cells.

41. A data processing system according to claim 36 wherein said cell selection list generating means includes a timing violation checking means for identifying a number of timing violations in the circuit design, and for identifying selected ones of the number of cells that should be substituted with logically equivalent cells having a different drive strength to minimize the number of timing violations.

* * * * *